(12) United States Patent
Enya et al.

(10) Patent No.: US 10,892,595 B2
(45) Date of Patent: Jan. 12, 2021

(54) OPTICAL MODULE

(71) Applicant: SUMITOMO ELECTRIC INDUSTRIES, LTD., Osaka (JP)

(72) Inventors: Yohei Enya, Osaka (JP); Masato Furukawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/499,549

(22) PCT Filed: Feb. 8, 2019

(86) PCT No.: PCT/JP2019/004531
§ 371 (c)(1),
(2) Date: Sep. 30, 2019

(87) PCT Pub. No.: WO2019/159827
PCT Pub. Date: Aug. 22, 2019

(65) Prior Publication Data
US 2020/0373729 A1 Nov. 26, 2020

(30) Foreign Application Priority Data

Feb. 16, 2018 (JP) .................................. 2018-025771

(51) Int. Cl.
*H01S 5/022* (2006.01)
*H01S 5/024* (2006.01)
*H01S 5/40* (2006.01)

(52) U.S. Cl.
CPC .............. *H01S 5/022* (2013.01); *H01S 5/024* (2013.01); *H01S 5/4025* (2013.01)

(58) Field of Classification Search
CPC .. H01S 5/022; H01S 5/02252; H01S 5/02268; H01S 5/02415; H01S 5/02461; H01S 5/024; H01S 5/4025; H01S 5/4093
See application file for complete search history.

(56) References Cited

U.S. PATENT DOCUMENTS

2015/0098127 A1* 4/2015 Kurokawa ............. H04B 10/50
359/484.03

FOREIGN PATENT DOCUMENTS

| JP | 2007-017925 A | 1/2007 |
|----|---------------|--------|
| JP | 2007-065600 A | 3/2007 |
| JP | 2007-328895 A | 12/2007 |
| JP | 2009-093101 A | 4/2009 |

* cited by examiner

*Primary Examiner* — Armando Rodriguez
(74) *Attorney, Agent, or Firm* — Oliff PLC

(57) ABSTRACT

An optical module includes a first semiconductor light-emitting element, a second semiconductor light-emitting element, a first lens, a second lens, a filter that multiplexes the first light and the second light, a base plate that has a first surface on which the first semiconductor light-emitting element, the second semiconductor light-emitting element, the first lens, the second lens, and the filter are mounted and a second surface opposite the first surface in a thickness direction, and a support base that is in contact with a part of the second surface and that supports the base plate. The base plate has a filter mounting region in which the filter is mounted. The optical module has a gap between a region of the second surface corresponding to the filter mounting region and the support base.

8 Claims, 16 Drawing Sheets

OPTICAL MODULE

TECHNICAL FIELD

The present disclosure relates to an optical module. The present application claims priority to Japanese Patent Application No. 2018-025771 filed on Feb. 16, 2018, the entire contents of which are hereby incorporated by reference.

BACKGROUND ART

An optical module in which a semiconductor light-emitting element is disposed in a package is known (see, for example, PTL 1 to 4). Such an optical module is used as a light source of various kinds of apparatuses such as a display apparatus, an optical pickup apparatus, and an optical communication apparatus.

CITATION LIST

Patent Literature

PTL 1: Japanese Unexamined Patent Application Publication No. 2009-93101
PTL 2: Japanese Unexamined Patent Application Publication No. 2007-328895
PTL 3: Japanese Unexamined Patent Application Publication No. 2007-17925
PTL 4: Japanese Unexamined Patent Application Publication No. 2007-65600

SUMMARY OF INVENTION

An optical module according to the present disclosure includes a first semiconductor light-emitting element including a first emitting portion that emits first light, a second semiconductor light-emitting element including a second emitting portion that emits second light having a wavelength different from a wavelength of the first light, a first lens that transforms the first light emitted from the first emitting portion into a collimated beam, a second lens that transforms the second light emitted from the second emitting portion into a collimated beam, a filter that multiplexes the first light and the second light, a base plate that has a first surface on which the first semiconductor light-emitting element, the second semiconductor light-emitting element, the first lens, the second lens, and the filter are mounted and a second surface opposite the first surface in a thickness direction, and a support base that is in contact with a part of the second surface and that supports the base plate. The base plate has a filter mounting region in which the filter is mounted, a lens mounting region in which the first lens and the second lens are mounted, and a semiconductor-light-emitting-element mounting region in which the first semiconductor light-emitting element and the second semiconductor light-emitting element are mounted. The optical module has a gap between a region of the second surface corresponding to the filter mounting region and the support base.

DESCRIPTION OF EMBODIMENTS

[Description of Embodiment of Present Disclosure]

Figure 1:
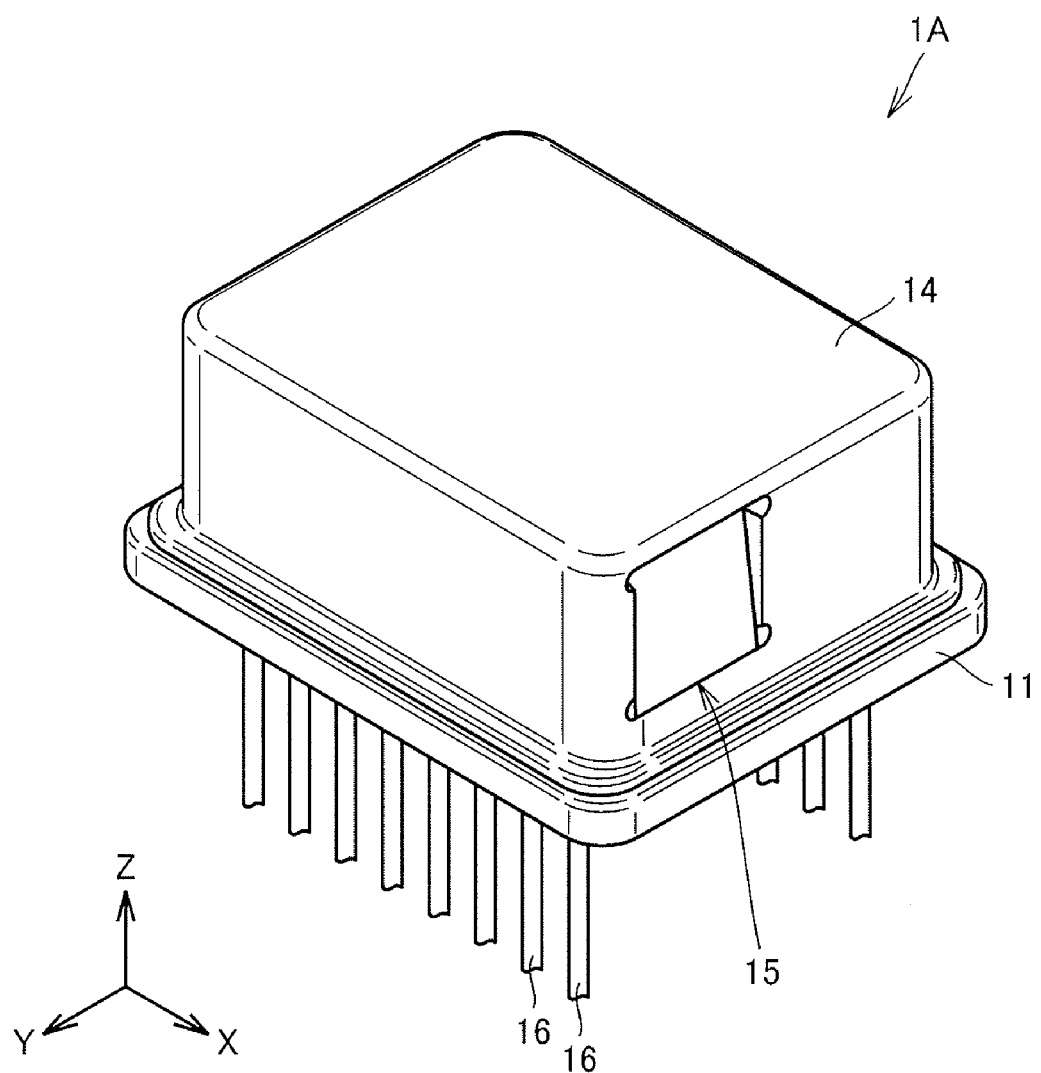
FIG. 1 is an exterior perspective view of the structure of an optical module according to an embodiment.
Figure 2:
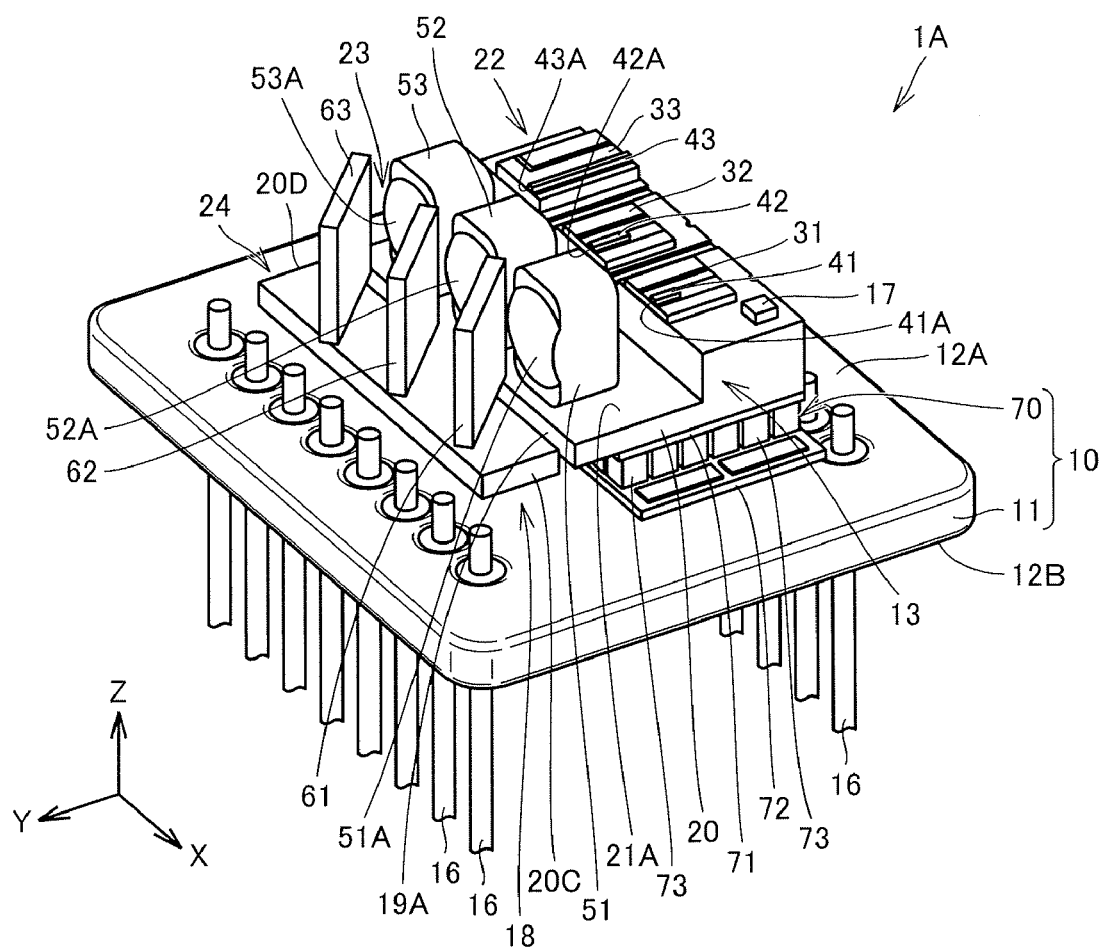
FIG. 2 is an exterior perspective view of the structure of the optical module according to the embodiment.

An embodiment of the present disclosure will be first listed and described. An optical module according to the present disclosure includes a first semiconductor light-emitting element including a first emitting portion that emits first light, a second semiconductor light-emitting element including a second emitting portion that emits second light having a wavelength different from a wavelength of the first light, a first lens that transforms the first light emitted from the first emitting portion into a collimated beam, a second lens that transforms the second light emitted from the second emitting portion into a collimated beam, a filter that multiplexes the first light and the second light, a base plate that has a first surface on which the first semiconductor light-emitting element, the second semiconductor light-emitting element, the first lens, the second lens, and the filter are mounted and a second surface opposite the first surface in a thickness direction, and a support base that is in contact with a part of the second surface and that supports the base plate. The base plate has a filter mounting region in which the filter is mounted, a lens mounting region in which the first lens and the second lens are mounted, and a semiconductor-light-emitting-element mounting region in which the first semiconductor light-emitting element and the second semiconductor light-emitting element are mounted. There is a gap between a region of the second surface corresponding to the filter mounting region and the support base.

The inventors pay attention to the fact that it is difficult for the optical axes of multiplexed light beams to coincide with each other with high precision due to variation in environmental temperature in an optical module that outputs the multiplexed light even when the light beams that are emitted from semiconductor light-emitting elements are multiplexed and outputted such that the optical axes thereof coincide with each other at a temperature, for example, at room temperature. Specifically, components of the optical module thermally expand, for example, when the temperature of the environment in which the optical module is installed is high. Warping occurs due to a difference in coefficient of thermal expansion between the components, and the optical axes of the light beams that are multiplexed are displaced as a result of being affected by warping, for example, even when the optical axes of the light beams coincide with each other at room temperature. The displacement of the optical axes reduces image quality when the optical module is used for imaging. In addition, the coupling efficiency of the light is reduced, and brightness is reduced when the optical module is used for illumination or medical treatment. In view of this, the inventors have seriously considered and have succeeded in enabling the optical axes of the light beams that are multiplexed to coincide with each other with high precision at a wide range of temperatures in the optical module according to the present disclosure.

In the optical module according to the present disclosure, the position of each lens is adjusted such that the optical axis of the first light that is emitted from the first semiconductor light-emitting element and the optical axis of the first lens coincide with each other and the optical axis of the second light that is emitted from the second semiconductor light-emitting element and the optical axis of the second lens coincide with each other, at a predetermined temperature, for example, room temperature (about 25° C.). The filter multiplexes the first light and the second light. Since there is the gap between the region of the second surface corresponding to the filter mounting region and the support base, the second surface corresponding to the filter mounting region and the support base can be separated from each other. Consequently, the amount of warping in the filter mounting region can be decreased more than the amount of warping in the semiconductor-light-emitting-element mounting region and the lens mounting region even when the temperature of the environment in which the optical module is disposed greatly varies. Accordingly, the filter that is mounted on the base plate can be inhibited from inclining due to warping of the base plate, and the optical axes of the first light and the second light that are multiplexed by the filter can be inhibited from being displaced. Consequently, the optical axes of the light beams that are multiplexed can coincide with each other with high precision at a wide range of temperatures.

In the above optical module, a notch may be formed in the base plate between the lens mounting region and the filter mounting region. With this structure, an effect of warping in the lens mounting region on the filter mounting region can be reduced. Accordingly, the filter can be further inhibited from inclining, and the optical axes of the light beams that are multiplexed can coincide with each other with high precision at a wide range of temperatures.

In the above optical module, a thickness of the base plate in the semiconductor-light-emitting-element mounting region may be more than a thickness of the base plate in the lens mounting region. A thickness of the base plate in the filter mounting region may be more than the thickness of the base plate in the lens mounting region. With this structure, the stiffness of the base plate in the filter mounting region is increased, and the amount of warping of the base plate in the filter mounting region can be decreased. Accordingly, the filter can be further inhibited from inclining, and the optical axes of the light beams that are multiplexed can coincide with each other with high precision at a wide range of temperatures.

In the above optical module, the lens mounting region may include a thick region in at least a part of a region other than a region in which the first lens is mounted and a region in which the second lens is mounted. In the thick region, a thickness of the base plate may be more than thicknesses of the base plate in the region in which the first lens is mounted and the region in which the second lens is mounted. With this structure, the stiffness of the base plate in the thick region of the lens mounting region is increased, and the amount of warping can be decreased. Accordingly, the region in which the second lens is mounted can be inhibited from being relatively displaced with respect to the region in which the first lens is mounted. The amount of warping in the semiconductor-light-emitting-element mounting region can be in the same range as that in the lens mounting region. Accordingly, the optical axes of the first semiconductor light-emitting element and the first lens, and the optical axes of the second semiconductor light-emitting element and the second lens can be inhibited from being relatively displaced, and the optical axes of the light beams that are multiplexed can coincide with each other with high precision at a wide range of temperatures.

In the above optical module, a region of the second surface corresponding to the lens mounting region and the support base may face each other with a gap that opens to the outside interposed therebetween. A notch may be formed between the semiconductor-light-emitting-element mounting region and the lens mounting region. With this structure, an effect of warping in the lens mounting region on the semiconductor-light-emitting-element mounting region can be reduced. Accordingly, the lens can be further inhibited from inclining, and the optical axes of the light beams that are multiplexed can coincide with each other with high precision at a wide range of temperatures.

In the above optical module, an emission direction of the first light and an emission direction of the second light may be parallel to each other. The second emitting portion may be located on a straight line that is perpendicular to the emission direction of the first light and that passes through the first emitting portion when viewed in a plan view in the thickness direction of the base plate. With this structure, an effect of warping in the semiconductor-light-emitting-element mounting region on the second light that is emitted from the second emitting portion with respect to the first light that is emitted from the first emitting portion can be reduced. Accordingly, the optical axis of the second light can be inhibited from being displaced with respect to the optical axis of the first light.

In the above optical module, the support base may include an electronic cooling module that is disposed in contact with the second surface of the base plate and that adjusts a temperature of at least one of the first semiconductor light-emitting element and the second semiconductor light-emitting element. With this structure, the temperature of the first semiconductor light-emitting element, or the second semiconductor light-emitting element, or both can be efficiently adjusted.

In the above optical module, the first semiconductor light-emitting element and the second semiconductor light-emitting element may be semiconductor lasers. With this structure, the optical axes are inhibited from being displaced at a wide range of temperatures when the semiconductor lasers are used for the optical module, and the optical axes of the light beams that are multiplexed can coincide with each other with high precision.

In the above optical module, the materials of components of the base plate, the support base, and the electronic cooling module can be selected such that a difference in coefficient of thermal expansion therebetween decreases. With this structure, warping due to the difference in coefficient of thermal expansion can be reduced, the optical axes are inhibited from being displaced at a wide range of temperatures, and the optical axes of the light beams that are multiplexed can coincide with each other with high precision.

[Detail of Embodiment of Present Disclosure]

An optical module according to an embodiment of the present disclosure will now be described with reference to the drawings. In the drawings described below, like or corresponding portions are designated by like reference characters, and a description thereof is not repeated.

First Embodiment

Figure 3:
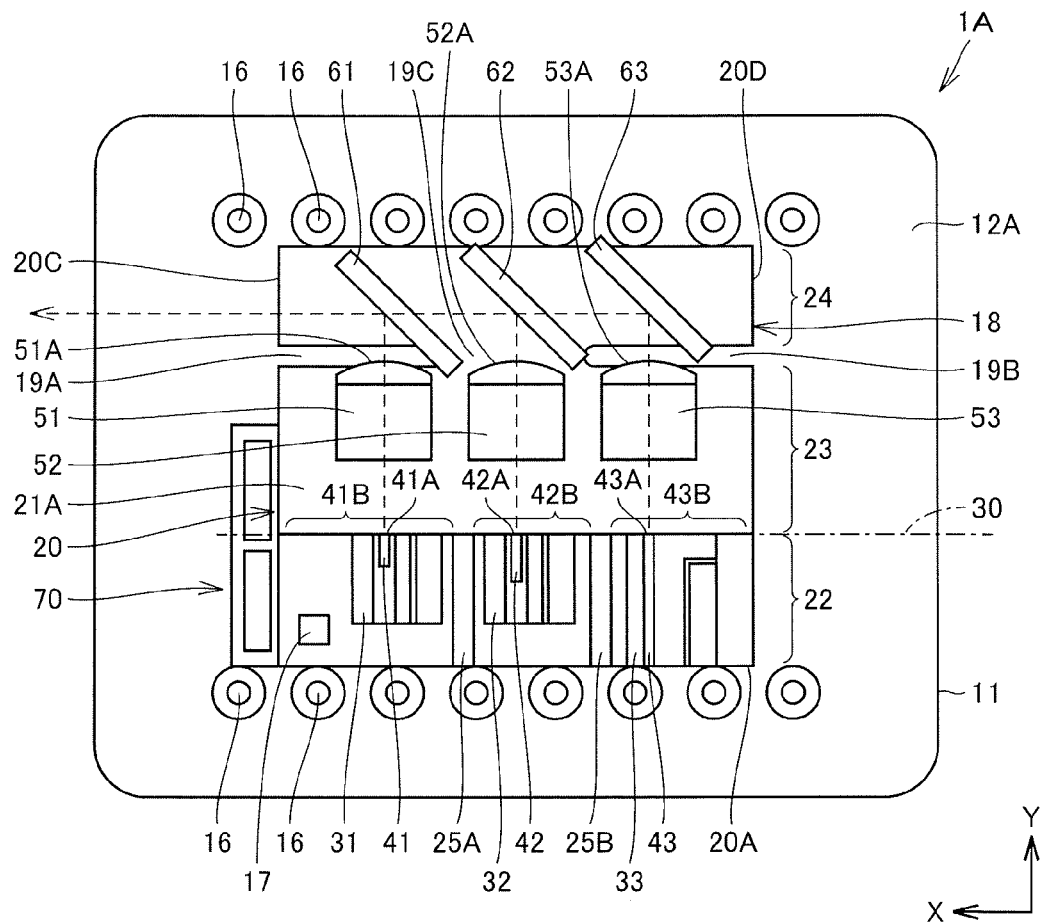
FIG. 3 is a plan view of the optical module illustrated in FIG. 2 with a cap removed.
Figure 4:
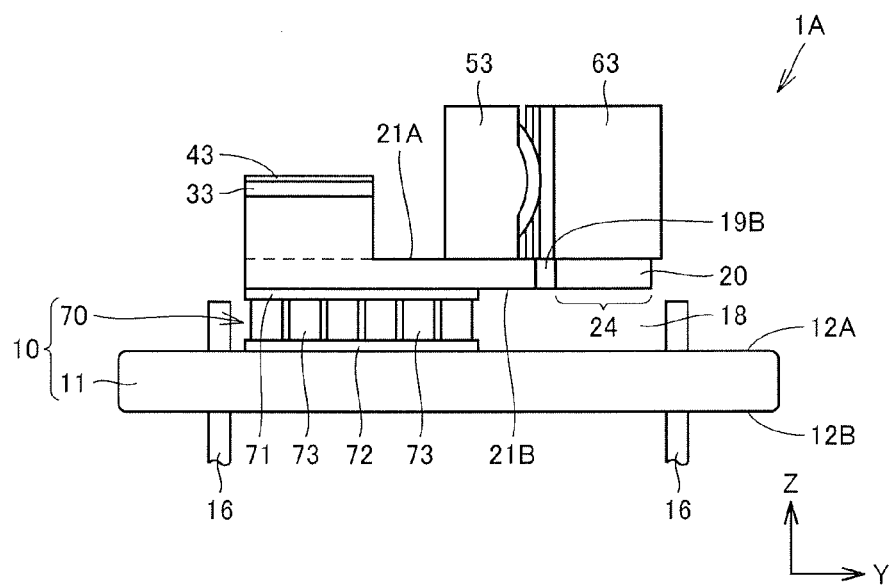
FIG. 4 is a side view of the optical module illustrated in FIG. 3 with the cap removed.

An optical module 1 according to a first embodiment will be described with reference to FIG. 1 to FIG. 4. In FIG. 3, optical axes are illustrated by dashed lines.

Referring to FIG. 1 to FIG. 4, an optical module 1A according to the first embodiment includes a support base 10 that includes a support plate 11 that has a flat plate shape, a light formation portion 13 that is disposed on a main surface 12A of the support plate 11 and that serves as a light formation unit that forms light, a cap 14 that is disposed such that the cap 14 covers the light formation portion 13 and is in contact with the main surface 12A of the support plate 11, and lead pins 16 that extend from the other main surface 12B of the support plate 11 to the main surface 12A and that project from both of the main surface 12A and the other main surface 12B. The support plate 11 and the cap 14 are in an airtight state, for example, by being welded to each other. That is, the light formation portion 13 is hermetic sealed by the support plate 11 and the cap 14. For example, a gas from which moisture is reduced (removed) such as dry air is enclosed in a space that is surrounded by the support plate 11 and the cap 14. The cap 14 has a light exit window 15 that is coated with an AR (Anti Reflection) coating composed of glass through which light from the light formation portion 13 passes. The support plate 11 has a rectangular shape the four corners of which are rounded when viewed in a plan view (when viewed in the Z-axis direction). Also, the cap 14 has a rectangular shape the four corners of which are rounded when viewed in a plan view. The area of the support plate 11 is larger than the area of the cap 14. When the cap 14 is disposed so as to be in contact with the support plate 11, the outer circumference of the support plate 11 projects from the outer circumference of the cap 14 into a flange shape. The support plate 11 is composed of, for example, iron or an iron-nickel-cobalt alloy. The coefficient of thermal expansion of iron is, for example, 12.6 (ppm/° C.), and the thermal conductivity thereof is 75 (W/(m·K)). The coefficient of thermal expansion of an iron-nickel-cobalt alloy is, for example, 5.2 (ppm/° C.), and the thermal conductivity thereof is 17 (W/(m·K)).

The light formation portion 13 includes a base plate 20 that has a plate shape. The base plate 20 is composed of, for example, copper, an iron-nickel-cobalt alloy, or AlN (aluminum nitride). The coefficient of thermal expansion of copper is, for example, 14.3 (ppm/° C.), and the thermal conductivity thereof is 398 (W/(m·K)). The coefficient of thermal expansion of AlN is, for example, 4.6 (ppm/° C.), and the thermal conductivity thereof is 170 (W/(m·K)). An example of combination of the above materials of the support plate 11 and the base plate 20 is that the material of the support plate 11 is an iron-nickel-cobalt alloy and the material of the base plate 20 is copper and an iron-nickel-cobalt alloy, or copper and AlN. In this case, regarding the example of the material of the base plate 20, the material of a region that is nearer than a dashed line illustrated in FIG. 4 to a third sub-mount 33 described later is copper, and the material of a region that is nearer than the dashed line to a TEC 70 described later is an iron-nickel-cobalt alloy or AlN. When a particularly high thermal conductivity is needed, AlN is used. The base plate 20 may be a single member or a combination of members integrally formed by, for example, joining.

The base plate 20 has a main surface 21A that serves as the first surface that has a rectangular shape when viewed in a plan view. The base plate 20 has the other main surface 21B that serves as the second surface opposite the main surface 21A in the thickness direction. The direction in which long sides of the base plate 20 extend is the same as the direction in which long sides of the support plate 11 extend (X-axis direction). The direction in which short sides of the base plate 20 extend is the same as the direction in which short sides of the support plate 11 extend (Y-axis direction). The base plate 20 has a semiconductor-light-emitting-element mounting region 22 in which semiconductor light-emitting elements can be mounted, a lens mounting region 23 in which lenses can be mounted, and a filter mounting region 24 in which filters can be mounted. The semiconductor-light-emitting-element mounting region 22, the lens mounting region 23, and the filter mounting region 24 have a rectangular shape when viewed in a plan view. The thickness of the semiconductor-light-emitting-element mounting region 22 is more than the thickness of the lens mounting region 23 and the thickness of the filter mounting region 24. Consequently, the height of the semiconductor-light-emitting-element mounting region 22 is more than the height of the lens mounting region 23 and the height of the filter mounting region 24. According to the present embodiment, the semiconductor-light-emitting-element mounting region 22, the lens mounting region 23, and the filter mounting region 24 are arranged in this order in the direction represented by an arrow Y.

A first sub-mount 31 that has a flat plate shape, a second sub-mount 32 that similarly has a flat plate shape, and the third sub-mount 33 that similarly has a flat plate shape are formed in the semiconductor-light-emitting-element mounting region 22. A blue laser diode 41, which is a first semiconductor laser that serves as the first semiconductor light-emitting element, is disposed on the first sub-mount 31. The blue laser diode 41 emits blue light as the first light from a first emitting portion 41A. A green laser diode 42, which is a second semiconductor laser that serves as the second semiconductor light-emitting element, is disposed on the second sub-mount 32. The green laser diode 42 emits green light as the second light from a second emitting portion 42A. A red laser diode 43, which is a third semiconductor laser that serves as a third semiconductor light-emitting element, is disposed on the third sub-mount 33. The red laser diode 43 emits red light as third light from a third emitting portion 43A. The blue light that is emitted from the blue laser diode 41, the green light that is emitted from the green laser diode 42, and the red light that is emitted from the red laser diode 43 are parallel to each other, and the emission direction thereof is the same as the Y-axis direction. When the second emitting portion 42A and the third emitting portion 43A are viewed in the thickness direction (Z-axis direction) of the base plate 20, the second emitting portion 42A and the third emitting portion 43A are located on a straight line 30 that is perpendicular to the emission direction (Y-axis direction) of the blue light and that passes through the first emitting portion 41A. The straight line 30 is illustrated by a one-dot chain line in FIG. 3. In this case, the first emitting portion 41A, the second emitting portion 42A, and the third emitting portion 43A are in the same plane (XZ plane) perpendicular to the emission direction of the blue light, the green light, and the red light. A thermistor 17 that measures the temperature of the light formation portion 13 is mounted in the semiconductor-light-emitting-element mounting region 22. The thermistor 17 is mounted adjacent to the first sub-mount 31 so as to be spaced apart therefrom.

A first lens 51, a second lens 52, and a third lens 53 are disposed in the lens mounting region 23. The first lens 51, the second lens 52, and the third lens 53 include lens portions 51A, 52A, and 53A that have respective lens surfaces. The central axes of the lens portions 51A, 52A, and 53A of the first lens 51, the second lens 52, and the third lens 53, that is, the optical axes of the lens portions 51A, 52A, and 53A are adjusted so as to be coincide with the optical axes of the blue laser diode 41, the green laser diode 42, and the red laser diode 43. In this case, the temperature of the atmosphere of the optical module 1A when the optical axes are adjusted is determined to be, for example, 25° C. The first lens 51, the second lens 52, and the third lens 53 transform light beams that are emitted from the blue laser diode 41, the green laser diode 42, and the red laser diode 43 into collimated beams. The first lens 51, the second lens 52, and the third lens 53 are secured in the lens mounting region 23 by using, for example, an ultraviolet curable adhesive.

A first filter 61, a second filter 62, and a third filter 63 are disposed in the filter mounting region 24. The first filter 61, the second filter 62, and the third filter 63 are secured in the filter mounting region 24 by using, for example, an ultraviolet curable adhesive. The first filter 61, the second filter 62, and the third filter 63 are, for example, wavelength selective filters. The first filter 61, the second filter 62, and the third filter 63 are also dielectric multilayer filters. Specifically, the first filter 61 allows the red light and the green light to pass therethrough but reflects the blue light. The second filter 62 allows the red light to pass therethrough but reflects the green light. The third filter 63 reflects the red light. The main surfaces of the first filter 61, the second filter 62, and the third filter 63 incline in the emission direction of the light beams that are emitted from the blue laser diode 41, the green laser diode 42, and the red laser diode 43. Specifically, the main surfaces of the first filter 61, the second filter 62, and the third filter 63 incline 45° with respect to the emission direction of the light beams that are emitted from the blue laser diode 41, the green laser diode 42, and the red laser diode 43. Consequently, the first filter 61, the second filter 62, and the third filter 63 multiplex the light beams that are emitted from the blue laser diode 41, the green laser diode 42, and the red laser diode 43.

The support base 10 includes an electronic cooling module (also referred to below as the TEC (Thermo-Electric Cooler)) 70. Specifically, the support base 10 includes the support plate 11 and the TEC 70. The TEC 70 is disposed between a part of the base plate 20 and the support plate 11. The TEC 70 is a so-called thermoelectric cooler and includes a heat absorption plate 71, a heat dissipation plate 72, and columnar semiconductor pillars 73 that are arranged at intervals between the heat absorption plate 71 and the heat dissipation plate 72 with an electrode interposed therebetween. The heat absorption plate 71 and the heat dissipation plate 72 are composed of, for example, alumina. The semiconductor pillar 73 is composed of, for example, BiTe. The coefficient of thermal expansion of alumina is, for example, 7.7 (ppm/° C.), and the thermal conductivity thereof is 36 (W/(m·K)). The coefficient of thermal expansion of BiTe is, for example, 15.0 (ppm/° C.), and the thermal conductivity thereof is 1.55 (W/(m·K)). The heat absorption plate 71 is disposed so as to be in contact with a part of the other main surface 21B of the base plate 20. In this case, a surface of the heat absorption plate 71 that faces the main surface 21B is joined to the main surface 21B by using Ag paste. The heat dissipation plate 72 is disposed so as to be in contact with a part of the main surface 12A of the support plate 11. The TEC 70 is a Peltier module (Peltier element). When the TEC 70 is supplied with an electric current to let the electric current to flow, the heat of the base plate 20 in contact with the heat absorption plate 71 is conducted toward the support plate 11, and the base plate 20 is cooled. Consequently, the temperature of the blue laser diode 41, the green laser diode 42, and the red laser diode 43 can be inhibited from increasing. That is, the TEC 70 enables the temperature of the blue laser diode 41, the green laser diode 42, and the red laser diode 43 to be efficiently adjusted.

The second surface corresponding to the filter mounting region 24, that is, a region of the other main surface 21B and the support base 10, specifically, the main surface 12A of the support plate 11 face each other with a gap 18 that opens to the outside interposed therebetween. The height of the gap 18, that is, the distance between the main surface 12A and the main surface 21B in the Z-axis direction corresponds to the height of the TEC 70 in the Z-axis direction. The gap 18 opens to the outside in one of the Y-axis directions and both of the X-axis directions. In this case, both of the semiconductor-light-emitting-element mounting region 22 and the lens mounting region 23 and the TEC 70 are in contact with each other.

A first notch 19A and a second notch 19B are formed between the lens mounting region 23 and the filter mounting region 24. The first notch 19A extends from a short side 20C of the base plate 20 that has a rectangular shape, where the blue laser diode 41 is located, when the base plate 20 is viewed in the thickness direction to the blue laser diode 41 and the green laser diode 42 in the X-axis direction. The second notch 19B extends from the other short side 20D of the base plate 20 that has the rectangular shape, where the red laser diode 43 is located, when the base plate 20 is viewed in the thickness direction to the red laser diode 43 and the green laser diode 42 in the X-axis direction. That is, the lens mounting region 23 and the filter mounting region 24 of the base plate 20 are connected to each other at a joint 19C that is located between the first notch 19A and the second notch 19B in the X-axis direction.

The semiconductor-light-emitting-element mounting region 22 includes a first thin region 25A, in which the thickness of the base plate 20 is less than those in a region 41B in which the blue laser diode 41 is mounted and a region 42B in which the green laser diode 42 is mounted, between the region 41B in which the blue laser diode 41, which is the first semiconductor light-emitting element, is mounted and the region 42B in which the green laser diode 42, which is the second semiconductor light-emitting element, is mounted. The semiconductor-light-emitting-element mounting region 22 includes a second thin region 25B, in which the thickness of the base plate 20 is less than those in the region 42B in which the green laser diode 42 is mounted and a region 43B in which the red laser diode 43 is mounted, between the region 42B in which the green laser diode 42, which is the second semiconductor light-emitting element, is mounted and the region 43B in which the red laser diode 43, which is the third semiconductor light-emitting element, is mounted. The first thin region 25A and the second thin region 25B are formed such that the height of the semiconductor-light-emitting-element mounting region 22 in the Z-axis direction decreases. The first thin region 25A and the second thin region 25B extend over the entire length of the semiconductor-light-emitting-element mounting region 22 in the Y-axis direction.

In the optical module 1A having this structure, since there is the gap 18 between the region of the other main surface 21B, which is the second surface corresponding to the filter mounting region 24, and the main surface 12A of the support plate 11, the other main surface 21b, which is the second surface corresponding to the filter mounting region 24, and the support base 10, that is, the support plate 11 in this case can be separated from each other. Consequently, the amount of warping in the filter mounting region 24 can be decreased more than the amount of warping in the semiconductor-light-emitting-element mounting region 22 and the lens mounting region 23 even when the temperature of the environment in which the optical module 1A is disposed greatly varies. Accordingly, the first filter 61, the second filter 62, and the third filter 63 that are mounted on the base plate 20 can be inhibited from inclining due to warping of the base plate 20, and the optical axes of the first light, the second light, and the third light that are multiplexed by the first filter 61, the second filter 62, and the third filter 63 can be inhibited from being displaced. Consequently, the optical axes of the light beams that are multiplexed can coincide with each other with high precision at a wide range of temperatures. In this case, the optical module 1A uses the blue laser diode 41, the green laser diode 42, and the red laser diode 43 as the semiconductor lasers, inhibits the optical axes from being displaced at a wide range of temperatures, and enables the optical axes of the blue light, the green light, and the red light that are multiplexed to coincide with each other with high precision.

In the optical module 1A, the first notch 19A and the second notch 19B are formed between the lens mounting region 23 and the filter mounting region 24. Accordingly, an effect of warping in the lens mounting region 23 on the filter mounting region 24 can be reduced. Accordingly, the first filter 61, the second filter 62, and the third filter 63 can be further inhibited from inclining, and the optical axes of the light beams that are multiplexed can coincide with each other with high precision at a wide range of temperatures.

In the optical module 1A, the semiconductor-light-emitting-element mounting region 22 includes the first thin region 25A, in which the thickness of the base plate 20 is less than those in the region 41B in which the blue laser diode 41 is mounted and the region 42B in which the green laser diode 42 is mounted, between the region 41B in which the blue laser diode 41 is mounted and the region 42B in which the green laser diode 42 is mounted. The semiconductor-light-emitting-element mounting region 22 includes the second thin region 25B, in which the thickness of the base plate 20 is less than those in the region 42B in which the green laser diode 42 is mounted and the region 43B in which the red laser diode 43 is mounted, between the region 42B in which the green laser diode 42 is mounted and the region 43B in which the red laser diode 43 is mounted. Accordingly, the optical axes of the blue laser diode 41 and the first lens 51, the optical axes of the green laser diode 42 and the second lens 52, and the optical axes of the red laser diode 43 and the third lens 53 can be inhibited from being relatively displaced, and the optical axes of the light beams that are multiplexed can coincide with each other with high precision at a wide range of temperatures.

In the optical module 1A, the emission direction of the blue light and the emission direction of the green light are parallel to each other. The second emitting portion 42A and the third emitting portion 43A are located on the straight line 30 that is perpendicular to the emission direction (Y-axis direction) of the blue light and that passes through the first emitting portion 41A when viewed in a plan view in the thickness direction (Z-axis direction) of the base plate 20. Consequently, an effect of warping in the semiconductor-light-emitting-element mounting region 22 on the green light that is emitted from the second emitting portion 42A with respect to the blue light that is emitted from the first emitting portion 41A can be reduced. In addition, an effect of warping in the semiconductor-light-emitting-element mounting region 22 on the red light that is emitted from the third emitting portion 43A with respect to the green light that is emitted from the second emitting portion 42A can be reduced. Accordingly, the optical axis of the blue light can be inhibited from being displaced with respect to the optical axis of the green light, and the optical axis of the red light can be inhibited from being displaced with respect to the optical axis of the green light.

Figure 5:
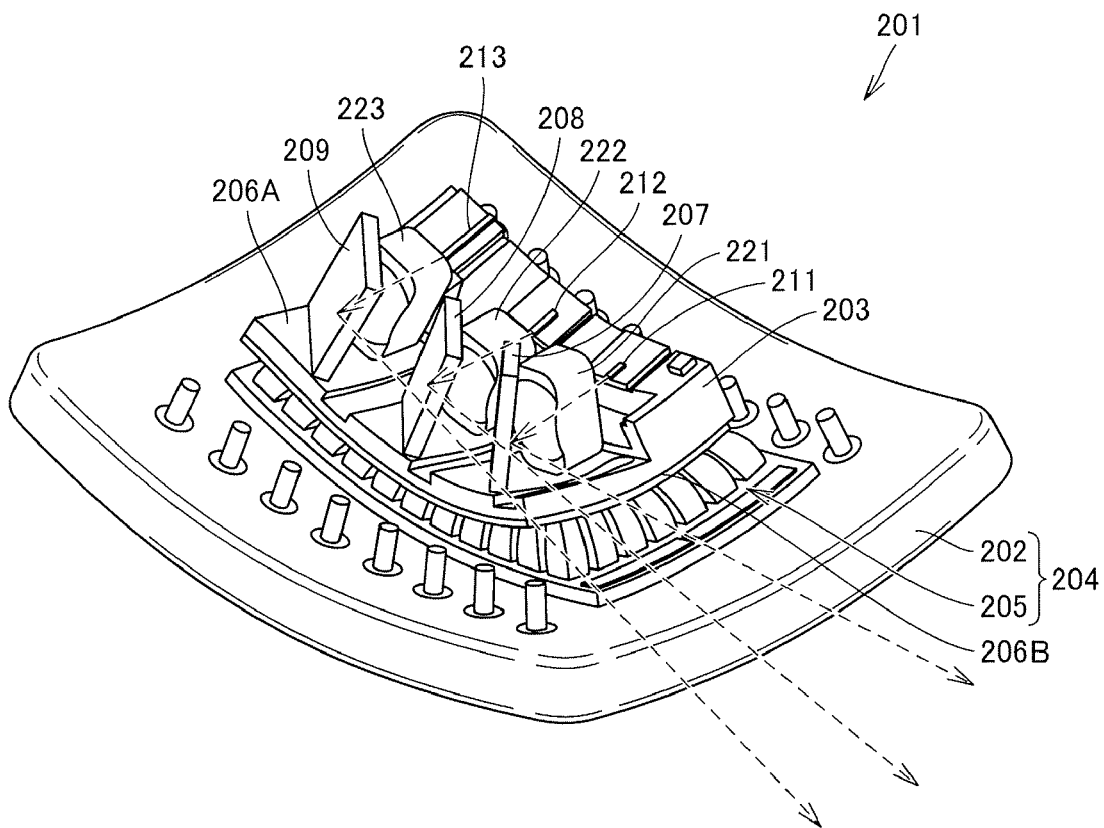
FIG. 5 schematically illustrates a perspective view of an optical module that does not have, for example, a gap, a first notch, or a second notch that the optical module illustrated in FIG. 2 and other figures has and exaggeratedly illustrates a state in which a support plate and a base plate warp at a high temperature (95° C.) due to a difference in coefficient of thermal expansion.

Inhibition of the displacement of each optical axis in the optical module 1A will now be described in more detail. In some cases, the optical module 1A is used at a wide range of temperatures, for example, at −40° C. to 105° C. FIG. 5 schematically illustrates a perspective view of an optical module 201 that does not have, for example, the gap 18, the first notch 19A, and the second notch 19B that the optical module 1A illustrated in FIG. 2 and other figures has and exaggeratedly illustrates a state in which a support plate 202 and a base plate 203 warp at a high temperature (95° C.) due to a difference in coefficient of thermal expansion. Referring to FIG. 5, a support base 204 that is included in the optical module 201 includes the support plate 202 and a TEC 205. The TEC 205 adheres to the base plate 203 and the support plate 202 with, for example, silver paste. In this case, the TEC 205 adheres to the whole of the other main surface 206B of the base plate 203. The TEC 205, the base plate 203, and the support plate 202 are composed of different materials and warp as illustrated in, for example, FIG. 5 at a high temperature such as 95° C. due to a difference in thermal expansion between the materials. That is, warping occurs in the directions of the long sides and short sides of the base plate 203 due to a change in the temperature of the environment in which the optical module 201 is disposed, specifically, an increase in the temperature of the environment in which the optical module 201 is disposed. The region in which a first filter 207, a second filter 208, and a third filter 209 are mounted also inclines. Consequently, the optical axes of the blue light, the green light, and the red light that are reflected by the first filter 207, the second filter 208, and the third filter 209 are displaced from positions adjusted at room temperature. Accordingly, it is desired that warping of the base plate 203 in the region in which the first filter 207, the second filter 208, and the third filter 209 are mounted be reduced, and that a change in the curvature of a main surface 206A in the region in which the first filter 207, the second filter 208, and the third filter 209 are mounted be reduced. Regarding the region in which a blue laser diode 211, which is a first semiconductor light-emitting element, a green laser diode 212, which is a second semiconductor light-emitting element, and a red laser diode 213, which is a third semiconductor light-emitting element, are mounted and the region in which a first lens 221, a second lens 222, and a third lens 223 are mounted, even when warping occurs, that is, the change in the curvature of the main surface 206A increases to a certain extent in the region in which the blue laser diode 211, the green laser diode 212, and the red laser diode 213 are mounted and the region in which the first lens 221, the second lens 222, and the third lens 223 are mounted, the displacement of the optical axis of each light that is multiplexed is less affected, provided that the displacements of the optical axis of the blue laser diode 211 and the optical axis of the first lens 221, the displacements of the optical axis of the green laser diode 212 and the optical axis of the second lens 222, and the displacements of the optical axis of the red laser diode 213 and the optical axis of the third lens 223 are not large. Naturally, the change in the curvature of the main surface 206A is preferably reduced as much as possible in the region in which the blue laser diode 211, the green laser diode 212, and the red laser diode 213 are mounted and the region in which the first lens 221, the second lens 222, and the third lens 223 are mounted.

Figure 6:
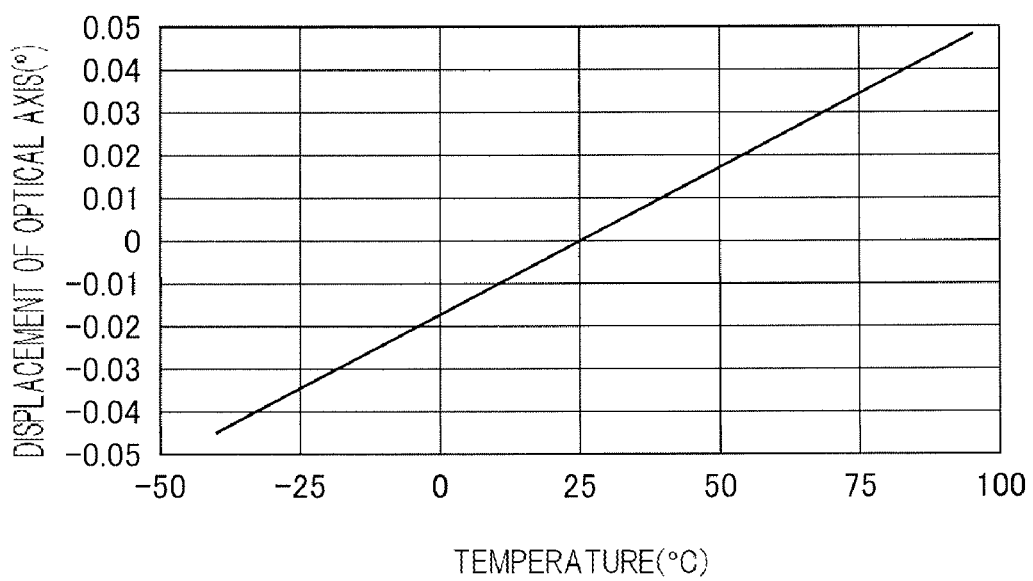
FIG. 6 is a graph illustrating a relationship between a displacement of an optical axis and temperature in the case of FIG. 5.

In FIG. 6, the vertical axis represents the displacement of an optical axis (°), and the horizontal axis represents the temperature (° C.) that is detected by the thermistor 17. In a graph illustrated in FIG. 6, the displacement of the optical axis of the blue light in the horizontal direction based on the green light is illustrated.

Referring to FIG. 6, the displacement of the optical axis exceeds 0.01° at 35° C. to 40° C. even when the displacement of the optical axis is 0° at 25° C., and it can be grasped that the displacement from the optical axis of the reference color increases with an increase in the temperature. In such circumstances, the optical axes of the light beams that are multiplexed cannot coincide with each other with high precision at a wide range of temperatures.

Figure 7:
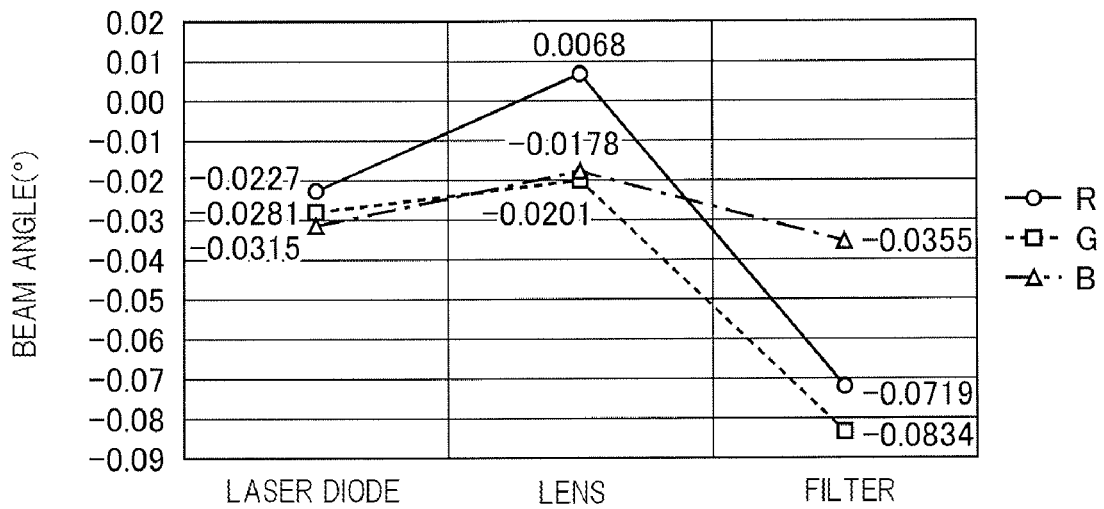
FIG. 7 is a graph illustrating a result of a simulation of a displacement of a beam angle in the Z-axis direction of components of the optical module that does not have, for example, the gap, the first notch, or the second notch and that is illustrated in FIG. 5 at a temperature of 95° C.

In FIG. 7, the vertical axis represents a beam angle (°), and the horizontal axis represents cases of the laser diodes, the lenses, and filters. The case of red is represented by circles, the case of green is represented by rectangles, and the case of blue is represented by triangles. FIG. 7 illustrates the displacement of the beam angle in the Z-axis direction in the case where the beam angle is 0° at a temperature of 25° C.

Referring to FIG. 7, the beam angle in all of the cases of blue, green, and red is slightly displaced during emission of the laser diodes and is negatively displaced, and a difference in the degree of the displacement for all of the colors is small. Regarding beams that pass through the lenses, the difference for blue and green is small, but the difference for red is large. Regarding beams that pass through the filters, the difference in displacement between the beams increases. That is, the value of the displacement of the beam angle for each color greatly varies. Regarding the light beams that pass through the filters, the displacement of the optical axis is less affected even when the filters incline. Accordingly, the inclination of each filter needs to be reduced as much as possible.

Figure 8:
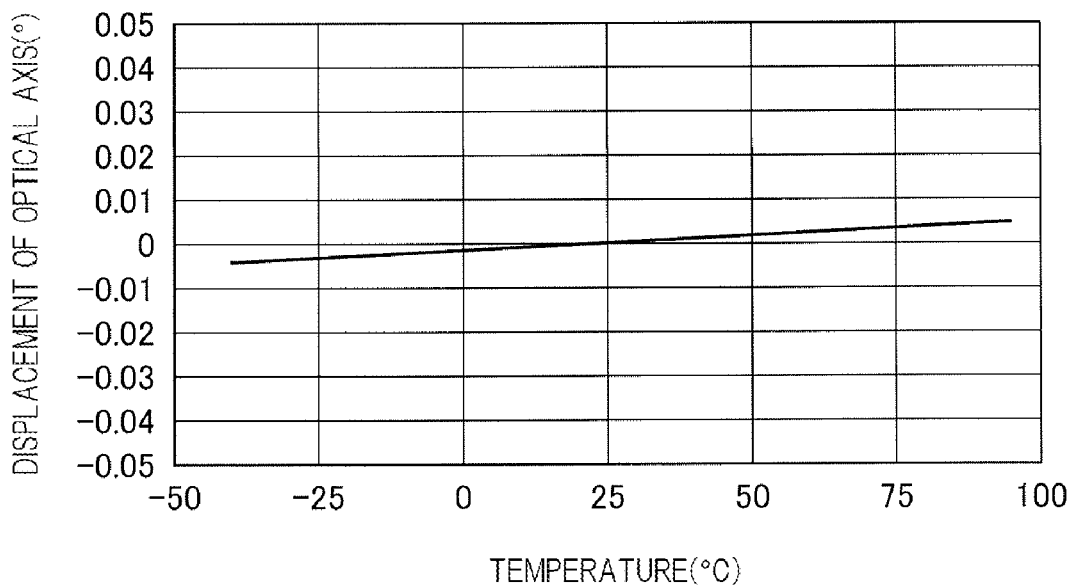
FIG. 8 is a graph illustrating a relationship between the displacement of the optical axis and the temperature when the optical module illustrated in FIG. 1 to FIG. 4 is used.

The optical module 1A according to the first embodiment of the present disclosure illustrated in FIG. 1 to FIG. 4 described above operates as follows. In FIG. 8, the vertical axis represents the displacement of an optical axis (°), and the horizontal axis represents the temperature (° C.) that is detected by the thermistor 17. A graph illustrated in FIG. 8 corresponds to the graph illustrated in FIG. 6. That is, in the graph illustrated in FIG. 8, the displacement of the optical axis of the blue light in the horizontal direction based on the green light is illustrated. Referring to FIG. 8, in the optical module 1A according to the first embodiment illustrated in FIG. 1 to FIG. 4, the displacement of the optical axis slightly increases with an increase in the temperature. However, the displacement of the optical axis is ±0.01° or less even when the temperature of the atmosphere increases to about 100° C., or decreases to about −40° C. When the displacement of the optical axis is in this range, a high quality image a color shift of which is reduced in each pixel can be obtained when the image is displayed by using the optical module and scanning by a MEMS mirror. Accordingly, the optical module according to the embodiment of the present disclosure can obtain a high quality image at a wide range of temperatures. When the displacement is in the above range, and the multiplexed light is coupled into an optical fiber in a single mode with a single lens, the coupling efficiency of the light is less affected. Accordingly, the optical module according to the embodiment of the present disclosure achieves high efficiency of coupling with the optical fiber in the single mode at a wide range of temperatures. Warping in the filter mounting region 24 of the optical module 1A can be reduced to 0.5 μm or less. The amount of warping can be measured by, for example, an optical three-dimensional shape-measuring instrument, or a stylus shape-measuring instrument.

The optical module 1A illustrated in FIG. 1 to FIG. 4 can be used for a display apparatus.

Figure 9:
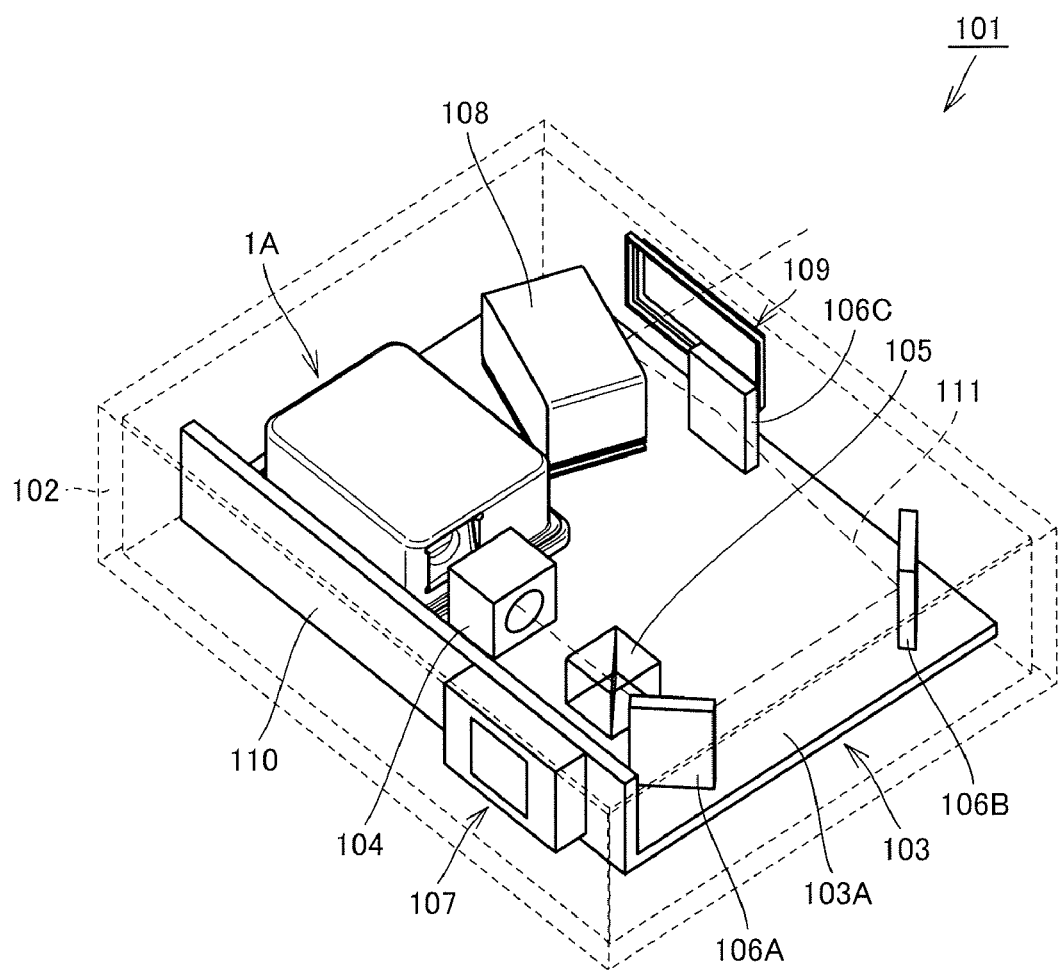
FIG. 9 schematically illustrates a perspective view of the structure of a display apparatus that includes an optical module according to a first embodiment.
Figure 10:
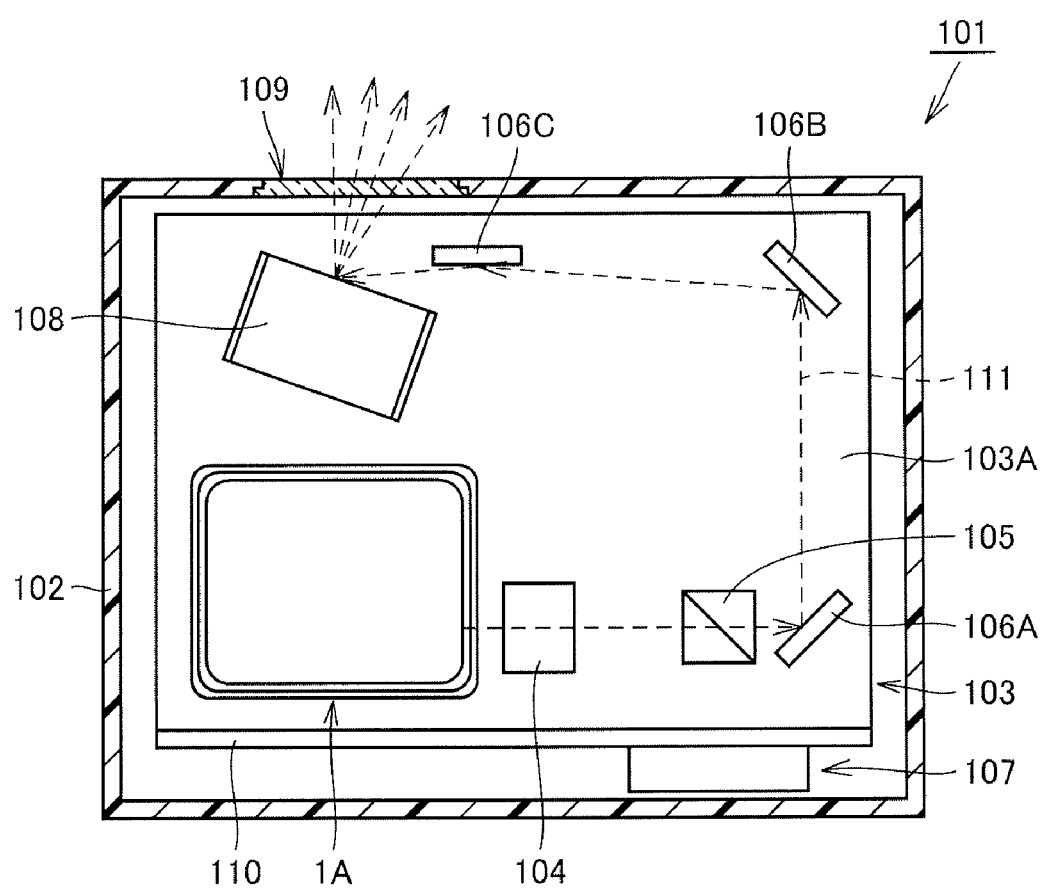
FIG. 10 is a plan view of the display apparatus illustrated in FIG. 9.

Referring to FIG. 9 and FIG. 10, a display apparatus 101 that uses the optical module 1A according to the first embodiment includes a package 102 (illustrated by dashed lines in FIG. 9) that has a rectangular cuboid shape, the optical module 1A that is disposed in the package 102, a base frame 103 that has a plate shape, a shaping lens 104, a beam splitter 105, three mirrors 106A, 106B, and 106C, a monitor photodiode 107, and a MEMS (Micro Electro Mechanical Systems) mirror 108 that can periodically change an angle by reciprocating. Light 111 that is emitted from the optical module 1A is illustrated by a dashed line. The package 102 has a light exit window 109 for output. The base frame 103 includes a wall portion 110 that is formed by folding a part of a rectangular plate member. The base frame 103 is disposed inside the package 102. The optical module 1A, the shaping lens 104, the beam splitter 105, the three mirrors 106A, 106B, and 106C, and the MEMS mirror 108 are disposed on a main surface 103A of the base frame 103. The monitor photodiode 107 is disposed on the wall portion 110. The shaping lens 104 is disposed at a position through which the light that is emitted from the optical module 1A passes to adjust the aspect ratio of the light. The beam splitter 105 is disposed at a position irradiated with the light that has passed through the shaping lens 104. A part of the light that is split by the beam splitter 105 is incident on the monitor photodiode 107 to monitor, for example, the amount of the light. The angle of the light is changed by the three mirrors 106A to 106C that are disposed on the base frame 103, and the light is incident on the MEMS mirror 108. The MEMS mirror 108 reflects the incident light and the light exits from the light exit window 109. A full-color image can be displayed by changing the angle of the MEMS mirror 108 in the horizontal and vertical directions at a high speed and modulating the output of the blue laser diode 41, the green laser diode 42, and the red laser diode 43 in conformity with the motion of the MEMS mirror 108.

The display apparatus 101 having this structure includes the optical module 1A that enables the optical axes of the light beams that are multiplexed to coincide with each other with high precision at a wide range of temperatures and achieves highly precise display at a wide range of temperatures. In particular, the optical module 1A enables the displacement of each optical axis to be ±0.01° or less as described above and enables more highly precise display to be achieved.

Second Embodiment

According to the first embodiment, the optical module 1A includes the blue laser diode 41 that emits the blue light, the green laser diode 42 that emits the green light, and the red laser diode 43 that emits the red light but is not limited thereto. The structure may be as follows.

Figure 11:
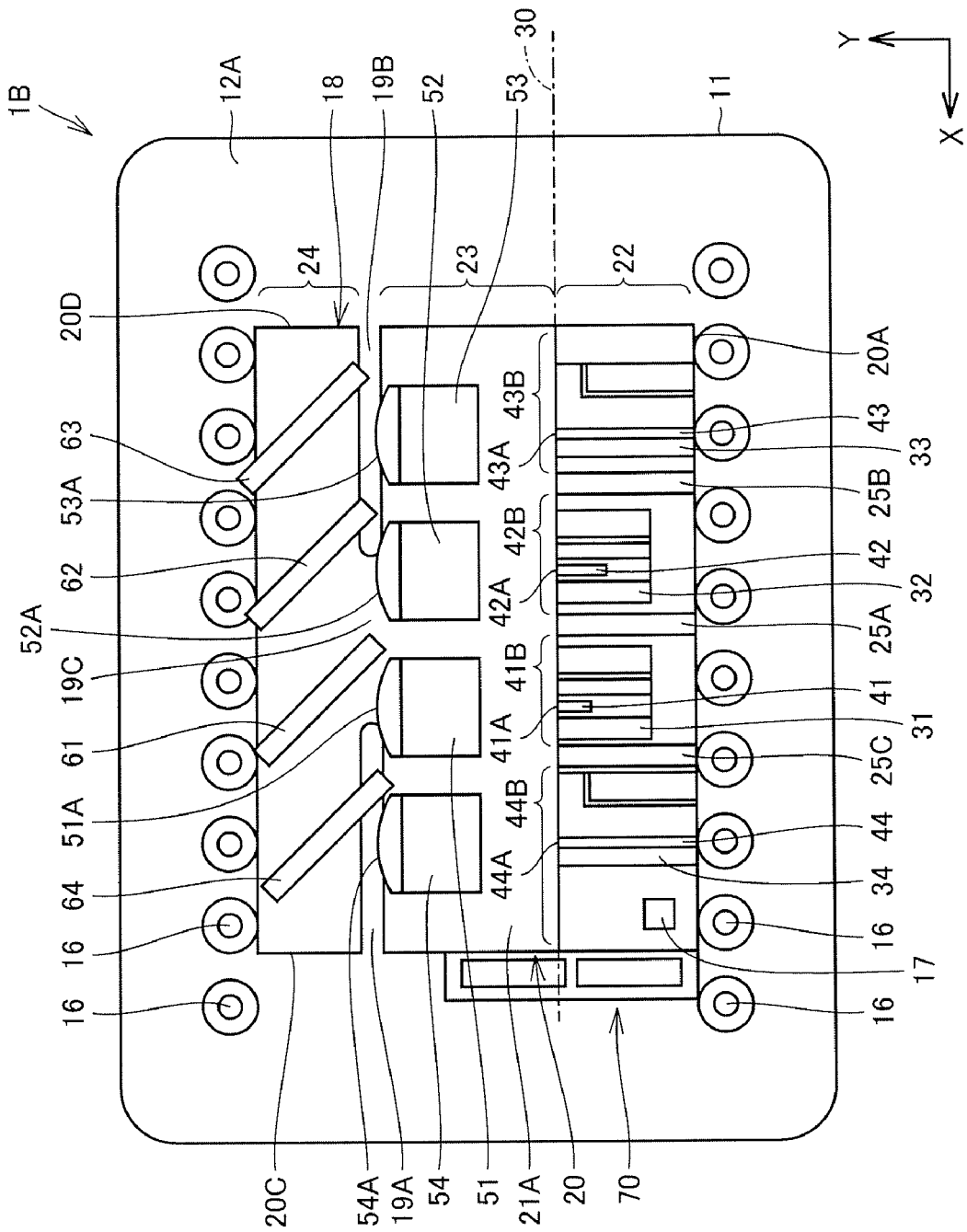
FIG. 11 illustrates the structure of an optical module according to a second embodiment.

Referring to FIG. 11, differences between an optical module 1B according to a second embodiment and that according to the first embodiment will be mainly described. The optical module 1B includes the blue laser diode 41 that emits the blue light, the green laser diode 42 that emits the green light, the red laser diode 43 that emits the red light, and an infrared laser diode 44 that emits infrared light. The infrared laser diode 44 is disposed on the opposite side of the blue laser diode 41 from the green laser diode 42 in the X-axis direction. The infrared laser diode 44 emits the infrared light as fourth light from a fourth emitting portion 44A.

A fourth lens 54 is disposed in the lens mounting region 23. The fourth lens 54 includes a lens portion 54A that has a lens surface. The central axis of the lens portion 54A of the fourth lens 54, that is, the optical axis of the lens portion 54A is adjusted so as to be coincide with the optical axes of the blue laser diode 41, the green laser diode 42, and the red laser diode 43. The fourth lens 54 transforms light that is emitted from the infrared laser diode 44 into a collimated beam. The semiconductor-light-emitting-element mounting region 22 includes a third thin region 25C, in which the thickness of the base plate 20 is less than those in the region 41B in which the blue laser diode 41 is mounted and a region 44B in which the infrared laser diode 44 is mounted, between the region 41B in which the blue laser diode 41 is mounted and the region 44B in which the infrared laser diode 44 is mounted.

A fourth filter 64 is disposed in the filter mounting region 24. The fourth filter 64 is, for example, a wavelength selective filter and a dielectric multilayer filter. Specifically, the fourth filter 64 allows the red light, the green light, and the blue light to pass therethrough and reflects the infrared light. The main surfaces of the fourth filter 64 incline in the emission direction of the light that is emitted from the infrared laser diode 44. The first filter 61, the second filter 62, the third filter 63, and the fourth filter 64 multiplex the light beams that are emitted from the blue laser diode 41, the green laser diode 42, the red laser diode 43, and the infrared laser diode 44. With this structure, the optical axes of the light beams that are multiplexed can coincide with each other with high precision.

Third Embodiment

Figure 12:
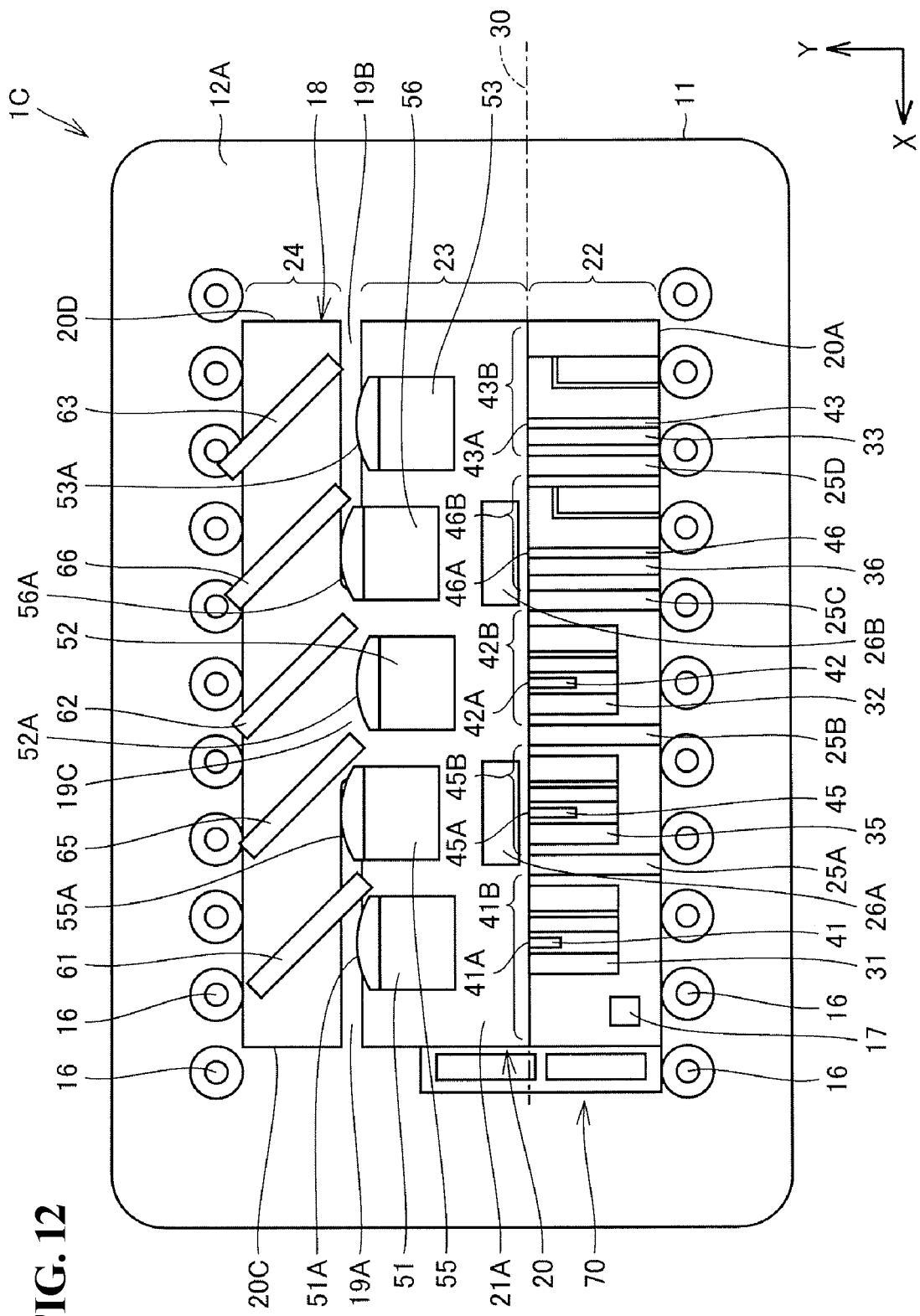
FIG. 12 illustrates the structure of an optical module according to a third embodiment.

Referring to FIG. 12, differences between an optical module 1C according to a third embodiment and that according to the first embodiment will be mainly described. The optical module 1C includes the blue laser diode 41 that emits the blue light, two green laser diodes 42 and 45 that emit the green light, and two red laser diodes 43 and 46 that emit the red light. The green laser diode 45 emits the green light as fifth light from a fifth emitting portion 45A. The red laser diode 46 emits the red light as sixth light from a sixth emitting portion 46A.

A fifth lens 55 that includes a lens portion 55A and that has the same structure as the second lens 52 and a sixth lens 56 that includes a lens portion 56A and that has the same structure as the third lens 53 are disposed in the lens mounting region 23. A half-wave plate 26A is disposed in the lens mounting region 23 between the green laser diode 45 and the fifth lens 55. A half-wave plate 26B is disposed in the lens mounting region 23 between the red laser diode 46 and the sixth lens 56. The semiconductor-light-emitting-element mounting region 22 includes the first thin region 25A, the second thin region 25B, the third thin region 25C, and a fourth thin region 25D, in which the thickness of the base plate 20 is less than those in the regions 41B to 43B and regions 45B and 46B, between the regions 41B to 43B and the regions 45B and 46B at intervals in the X-axis direction.

A fifth filter 65 and a sixth filter 66 are disposed in the filter mounting region 24. The fifth filter 65 and the sixth filter 66 are, for example, polarization light selective and wavelength selective filters and dielectric multilayer filters. The light beams that are emitted from the blue laser diode 41, the green laser diodes 42 and 45, and the red laser diodes 43 and 46 are polarized. The polarized light beams are in, for example, a TE mode and are polarized nearly in the X-axis direction in FIG. 12. The light that is emitted from the green laser diode 45 is incident on the half-wave plate 26A, and the light that is emitted from the red laser diode 46 is incident on the half-wave plate 26B. The polarized light beams are rotated 90 degrees. That is, the light beams are polarized nearly in the direction perpendicular to the XY plane in FIG. 12 and emitted. The fifth filter 65 allows the red light and p-polarization green light to pass therethrough and reflects s-polarization green light. The sixth filter 66 allows p-polarization red light to pass therethrough and reflects s-polarization red light. The main surfaces of the fifth filter 65 and the sixth filter 66 incline with respect to the emission direction of the light beams that are emitted from the green laser diode 45 and the red laser diode 46. The light beams that are emitted from the blue laser diode 41, the green laser diode 42, and the red laser diode 43 are incident on the first filter 61, the second filter 62, and the third filter 63 as p-polarization light. The light beams that are emitted from the green laser diode 45 and the red laser diode 46 are incident on the fifth filter 65 and the sixth filter 66 as s-polarization light. Accordingly, the first filter 61, the second filter 62, the third filter 63, the fourth filter 64, the fifth filter 65, and the sixth filter 66 multiplex the light beams that are emitted from the blue laser diode 41, the green laser diodes 42 and 45, and the red laser diodes 43 and 46. This structure may be permitted.

Fourth Embodiment

Figure 13:
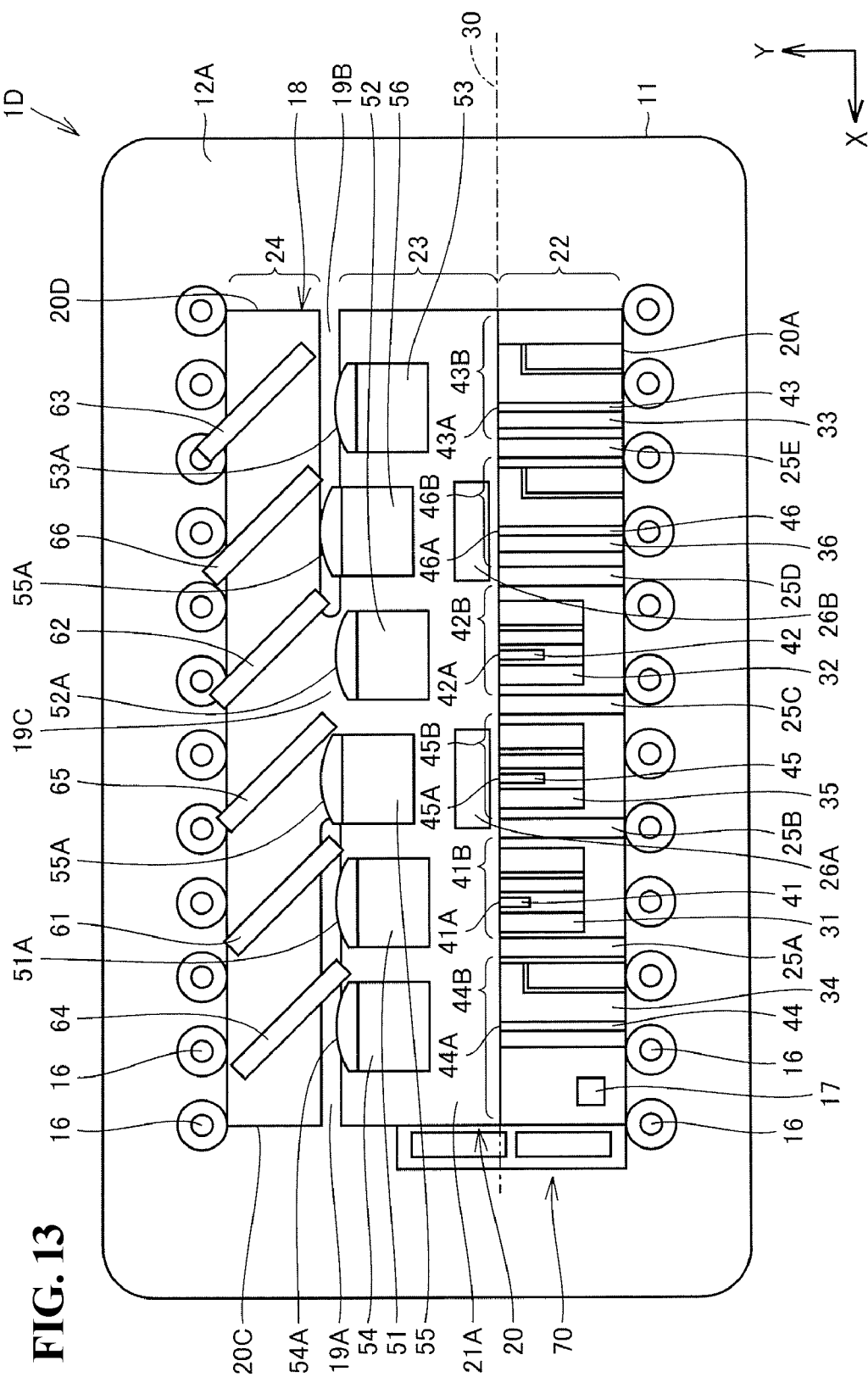
FIG. 13 illustrates the structure of an optical module according to a fourth embodiment.

Referring to FIG. 13, differences between an optical module 1D according to a fourth embodiment and those according to the first embodiment to the third embodiment will be mainly described. The optical module 1D includes the blue laser diode 41 that emits the blue light, the two green laser diodes 42 and 45 that emit the green light, the two red laser diodes 43 and 46 that emit the red light, and the infrared laser diode 44 that emits the infrared light.

The sixth lens 56 that has the same structure as the third lens 53, the fifth lens 55 that has the same structure as the second lens 52 described according to the third embodiment, and the fourth lens 54 described according to the second embodiment are disposed in the lens mounting region 23. The half-wave plate 26A is disposed in the lens mounting region 23 between the green laser diode 45 and the fifth lens 55. The half-wave plate 26B is disposed in the lens mounting region 23 between the red laser diode 46 and the sixth lens 56. The semiconductor-light-emitting-element mounting region 22 includes the first thin region 25A, the second thin region 25B, the third thin region 25C, the fourth thin region 25D, and a fifth thin region 25E, in which the thickness of the base plate 20 is less than those in the regions 41B to 46B, between the regions 41B to 46B at intervals in the X-axis direction.

The fourth filter 64, the fifth filter 65, and the sixth filter 66 are disposed in the filter mounting region 24. With this structure, the optical axes of the light beams that are multiplexed can coincide with each other with high precision.

Fifth Embodiment

Figure 14:
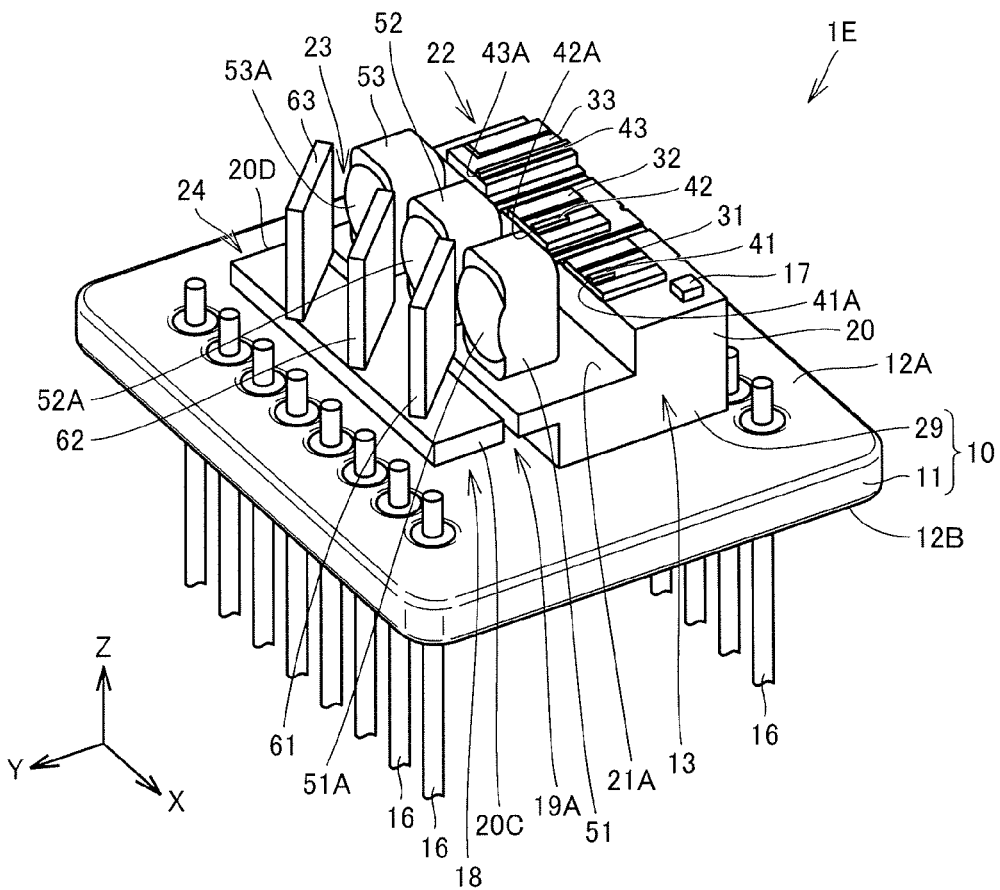
FIG. 14 illustrates the structure of an optical module according to a fifth embodiment.
Figure 15:
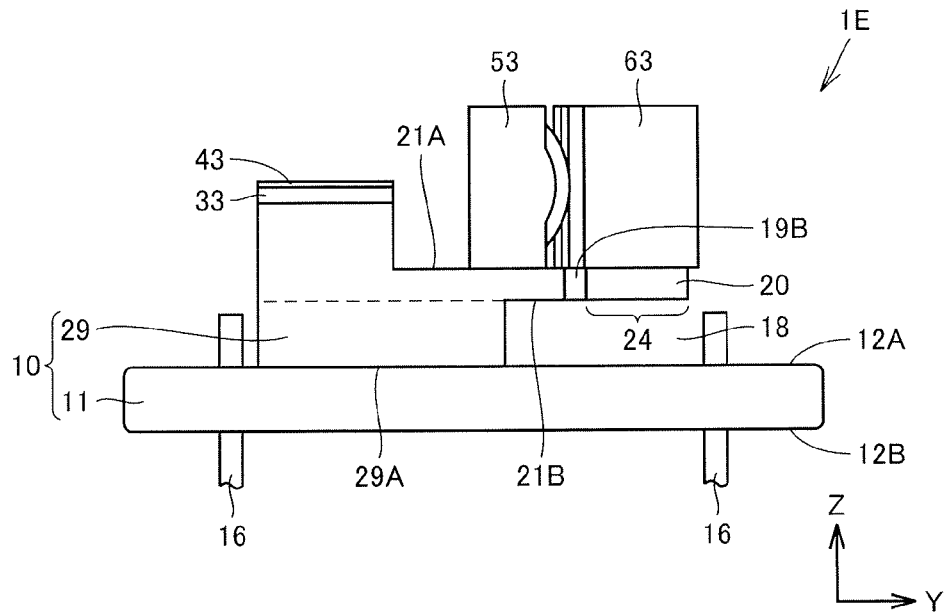
FIG. 15 is a side view of the optical module illustrated in FIG. 14.

Referring to FIG. 14 to FIG. 15, differences between an optical module 1E according to a fifth embodiment and that according to the first embodiment will be mainly described.

The optical module 1E does not include the TEC 70 unlike the optical module 1A described according to the first embodiment. The support base 10 that is included in the optical module 1E includes the support plate 11 and a protruding portion 29. The protruding portion 29 has a shape projecting from a part of the main surface 21B of the base plate 20 in a region near the semiconductor-light-emitting-element mounting region 22 in the semiconductor-light-emitting-element mounting region 22 and the lens mounting region 23. The boundary between the protruding portion 29 and the base plate 20 is illustrated by a dashed line in FIG. 15. A main surface 29A of the protruding portion 29 on the base plate 20 and the main surface 12A of the support plate 11 are in contact with each other. The optical module 1E may have this structure including no TEC 70. Also, with this structure, the optical axes of the light beams that are multiplexed can coincide with each other with high precision.

Sixth Embodiment

Figure 16:
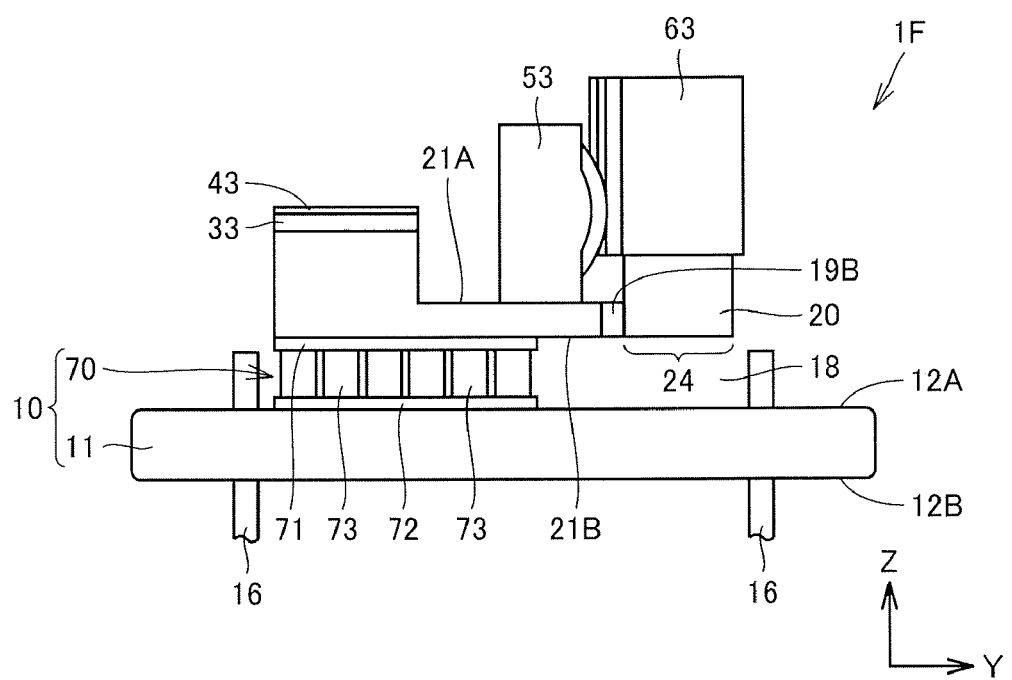
FIG. 16 illustrates the structure of an optical module according to a sixth embodiment.

Referring to FIG. 16, differences between an optical module 1F according to a sixth embodiment and that according to the first embodiment will be mainly described.

The thickness of the filter mounting region 24 of the optical module 1F is more than that in the optical module 1A according to the first embodiment. That is, the thickness of the base plate 20 in the filter mounting region 24 is more than the thickness of the base plate 20 in the lens mounting region 23. With this structure, the stiffness of the base plate 20 in the filter mounting region 24 is increased, and the amount of warping of the base plate 20 in the filter mounting region 24 can be decreased. Accordingly, the first filter, the second filter, and the third filter can be further inhibited from inclining, and the optical axes of the light beams that are multiplexed can coincide with each other with high precision at a wide range of temperatures.

Seventh Embodiment

Figure 17:
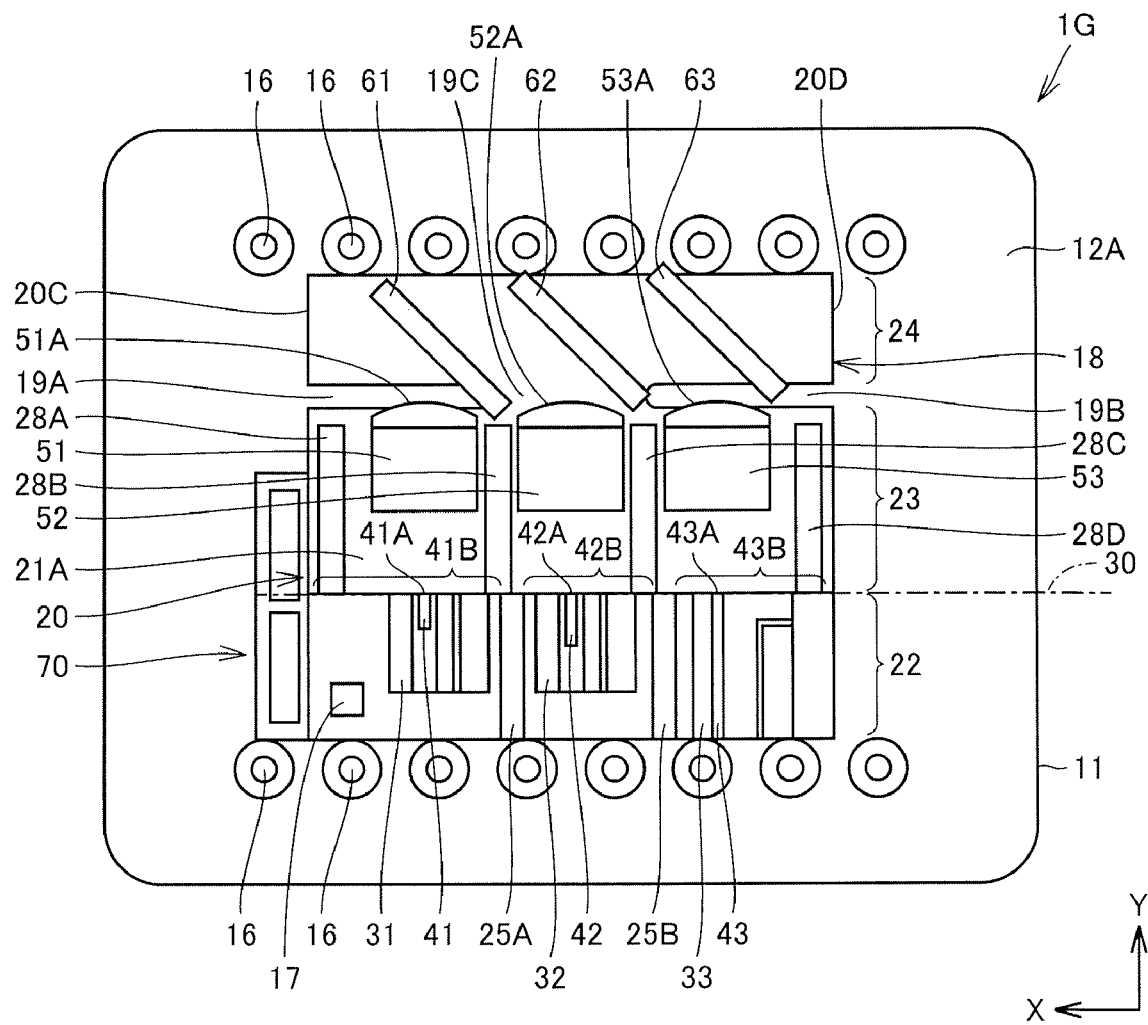
FIG. 17 illustrates the structure of an optical module according to a seventh embodiment.

Referring to FIG. 17, differences between an optical module 1G according to a seventh embodiment and that according to the first embodiment will be mainly described.

The thickness of parts of the lens mounting region 23 of the optical module 1G is more than that in the optical module 1A according to the first embodiment. That is, the lens mounting region 23 includes a first thick region 28A, a second thick region 28B, a third thick region 28C, and a fourth thick region 28D, in which the thickness of the base plate 20 is more than those in the region in which the first lens 51 is mounted, the region in which the second lens 52 is mounted, and the region in which the third lens 53 is mounted, within at least regions other than the region in which the first lens 51 is mounted, the region in which the second lens 52 is mounted, and the region in which the third lens 53 is mounted, specifically, within regions on both sides of the region in which the first lens 51 is mounted in the X-axis direction, and regions on both sides of the region in which the third lens 53 is mounted in the X-axis direction. The first thick region 28A to the fourth thick region 28D have a long rectangular shape in the Y-axis direction when viewed in a plan view in the thickness direction of the base plate 20. Specifically, the first thick region 28A to the fourth thick region 28D extend to the location of the semiconductor-light-emitting-element mounting region 22. With this structure, the stiffness of the base plate 20 in the first thick region 28A to the fourth thick region 28D within the lens mounting region 23 can be increased, and the amount of warping can be reduced. Accordingly, the region in which the second lens 52 is mounted and the region in which the third lens 53 is mounted can be inhibited from being relatively displaced with respect to the region in which the first lens 51 is mounted. In addition, the amount of warping in the semiconductor-light-emitting-element mounting region 22 can be in the same range as that in the lens mounting region 23. Accordingly, the optical axes of the blue laser diode 41 and the first lens 51, the optical axes of the green laser diode 42 and the second lens 52, and the optical axes of the red laser diode 43 and the third lens 53 can be inhibited from being relatively displaced, and the optical axes of the light beams that are multiplexed can coincide with each other with high precision at a wide range of temperatures. The number, size, and arrangement of thick portions of the lens mounting region 23 can be freely determined depending on, for example, the environment.

Eighth Embodiment

Figure 18:
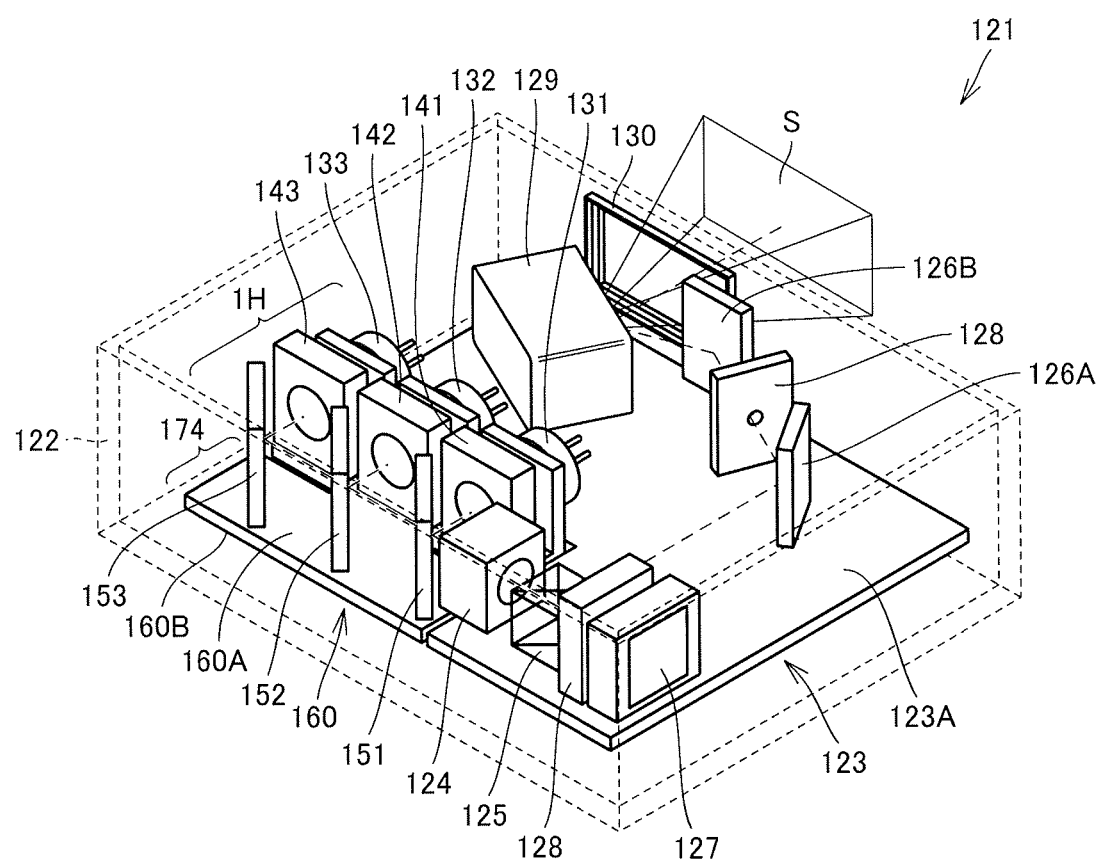
FIG. 18 schematically illustrates a perspective view of the structure of a display apparatus that includes an optical module according to an eighth embodiment.
Figure 19:
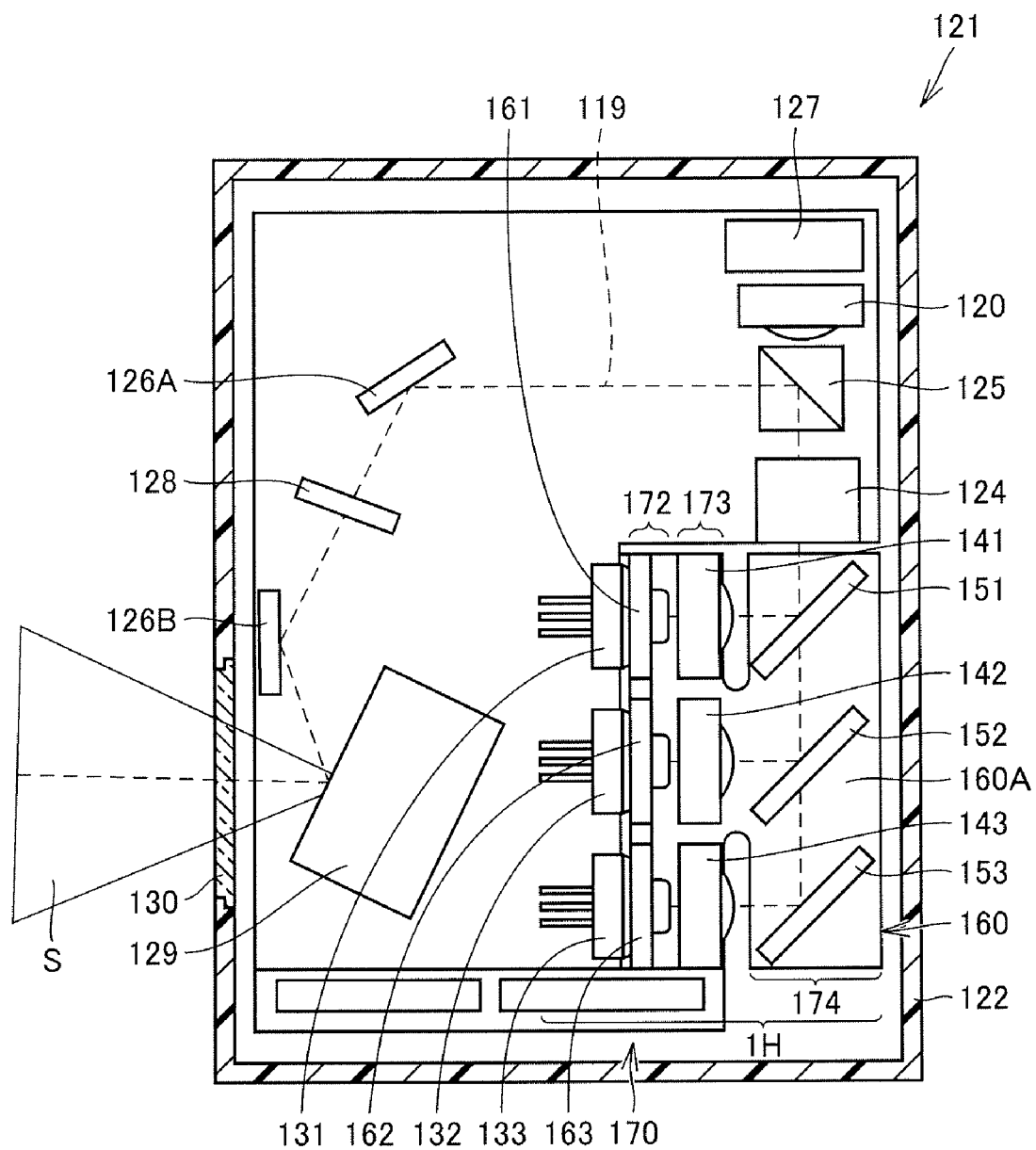
FIG. 19 is a plan view of the display apparatus that includes the optical module according to the eighth embodiment illustrated in FIG. 18.
Figure 20:
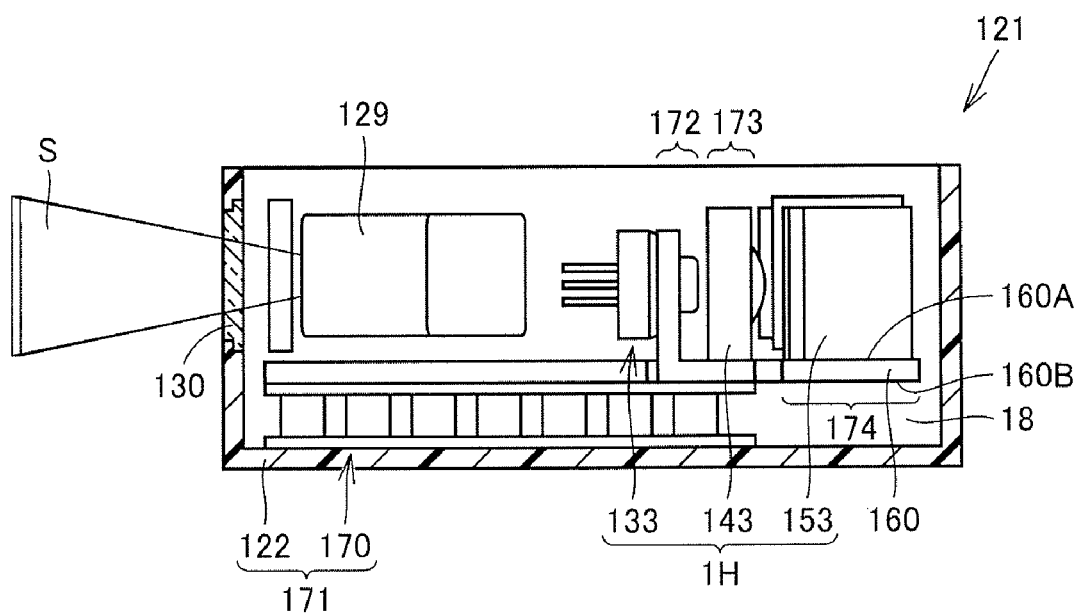
FIG. 20 is a sectional view of the display apparatus that includes the optical module according to the eighth embodiment illustrated in FIG. 18.

Referring to FIG. 18 to FIG. 20, an optical module 1H according to an eighth embodiment and a display apparatus 121 that includes the optical module 1H will be described. The display apparatus 121 includes the optical module 1H, a package 122, a base frame 123 that has a plate shape, a shaping lens 124, a beam splitter 125, two mirrors 126A and 126B, a monitor photodiode 127, an aperture 128, a MEMS mirror 129 that can periodically change an angle by reciprocating, and a lens 120. Light 119 that is emitted from the optical module 1H is illustrated by a dashed line. The package 122 has a light exit window 130 for output. The base frame 123 has a rectangular shape. The base frame 123 is disposed inside the package 122. The optical module 1H, the shaping lens 124, the beam splitter 125, the two mirrors 126A and 126B, the monitor photodiode 127, the aperture 128, and the MEMS mirror 129 are disposed on a main surface 123A of the base frame 123. The shaping lens 124 is disposed at a position through which the light that is emitted from the optical module 1H passes to adjust the aspect ratio of the light. The beam splitter 125 is disposed at a position irradiated with the light that has passed through the shaping lens 124. A part of the light that is split by the beam splitter 125 is incident on the monitor photodiode 127 via the lens 120 to monitor, for example, the amount of the light. The angle of the light is changed by the two mirrors 126A and 126B that are disposed on the base frame 123, stray light is removed by the aperture 128, and the light is incident on the MEMS mirror 129. The MEMS mirror 129 reflects the incident light and the light exits from the light exit window 130. The range of an image that is displayed by the display apparatus 121 is illustrated by a region S.

The optical module 1H includes laser diodes 131, 132, and 133 the type of which is a so-called CAN type. The laser diode 131 emits the blue light, the laser diode 132 emits the green light, and the laser diode 133 emits the red light. The optical module 1H also includes a first lens 141, a second lens 142, and a third lens 143 that transform the light beams from the laser diodes 131 to 133, which are semiconductor light-emitting elements, into collimated beams. The optical module 1H also includes a first filter 151, a second filter 152, and a third filter 153. The first filter 151 reflects the blue light and allows the green light and the red light to pass therethrough. The second filter 152 reflects the green light and allows the red light to pass therethrough. The third filter 153 reflects the red light. The laser diodes 131 to 133, the first lens 141 to the third lens 143, and the first filter 151 to the third filter 153 are mounted on a base plate 160 that is included in the optical module 1H. The laser diodes 131 to 133 are mounted on wall portions 161, 162, and 163 that are included in the base plate 160 and that extend in the thickness direction of the base plate 160. There are spaces between the wall portions 161, 162, and 163. The first filter 151 to the third filter 153 are mounted in a filter mounting region 174 of a main surface 160A of the base plate 160, which is the first surface of the base plate 160. The first lens 141 to the third lens 143 are mounted in a lens mounting region 173 of the main surface 160A of the base plate 160. In this case, the laser diodes 131 to 133 that are mounted on the wall portions 161 to 163 are mounted on the main surface 160A in a semiconductor-light-emitting-element mounting region 172.

The optical module 1H includes a TEC 170. The TEC 170 is disposed between the base plate 160 and the package 122 and between the base frame 123 and the package 122. A support base 171 is formed by a part of the package 122 and the TEC 170. A region of the other main surface 160B of the base plate 160, which is the second surface corresponding to the filter mounting region 174, faces the support base 171 with the gap 18 interposed therebetween.

The display apparatus 121 having this structure includes the optical module 1H that enables the optical axes of the light beams that are multiplexed to coincide with each other with high precision at a wide range of temperatures and achieves highly precise display at a wide range of temperatures.

(Modification)

According to the above embodiments, laser semiconductor is used as each semiconductor light-emitting element, which is not limited thereto. For example, a light-emitting diode may be used as the semiconductor light-emitting element.

The above embodiments, in which three or more colors are multiplexed and outputted, are not limited thereto but are used for the case where two colors are multiplexed and outputted.

According to the above embodiments, the base plate 20 has the first notch 19A and the second notch 19B, but is not limited thereto, and may have any one of the notches. The shape and width of the first notch 19A, that is, the distance between the semiconductor-light-emitting-element mounting region 22 and the lens mounting region 23, and the length of each of recesses from the short sides 20C and 20D, for example, can be freely determined depending on the environment and the material of each component. The number and shape of each thin region that is included in the semiconductor-light-emitting-element mounting region 22 of the base plate 20, for example, can be freely determined depending on the environment and the material of each component.

According to the above embodiments, there may be a gap between a region of the second surface of the base plate 20 corresponding to the lens mounting region 23 and the support base 10. The region of the second surface of the base plate 20 and the support base 10 may face each other with a gap interposed therebetween. A notch may be formed between the semiconductor-light-emitting-element mounting region 22 and the lens mounting region 23. With this structure, an effect of warping in the lens mounting region 23 on the semiconductor-light-emitting-element mounting region 22 can be reduced. Accordingly, the lenses can be inhibited from inclining, the optical axes of the light beams that are multiplexed can coincide with each other with high precision at a wide range of temperatures.

It is to be understood that the embodiments are disclosed herein by way of example in all aspects and are not restrictive in any aspect. The scope of the present invention is defined not by the above description but by the scope of claims and includes modifications having the same meaning and range as the scope of claims.

REFERENCE SIGNS LIST 1A, 1B, 1C, 1D, 1E, 1F, 1G, 1H, 201 optical module
10, 171, 204 support base
11, 202 support plate
12A, 12B, 21A, 21B, 160A, 160B, 206A, 206B main surface
13 light formation portion
14 cap
15, 109, 130 light exit window
16 lead pin
17 thermistor
18 gap
19A first notch
19B second notch
19C joint
20, 160, 203 base plate
20A, 20C, 20D side
22, 172 semiconductor-light-emitting-element mounting region
23, 173 lens mounting region
24, 174 filter mounting region
25A first thin region
25B second thin region
25C third thin region 25D fourth thin region
25E fifth thin region
26A, 26B half-wave plate
28A first thick region
28B second thick region
28C third thick region
28D fourth thick region
29 protruding portion
30 straight line
31 first sub-mount
32 second sub-mount
33 third sub-mount
34 fourth sub-mount
35 fifth sub-mount
36 sixth sub-mount
41, 211 blue laser diode
41A first emitting portion
41B, 42B, 43B, 44B, 45B region
42, 45, 212 green laser diode
42A second emitting portion
43, 46, 213 red laser diode
43A third emitting portion
44 infrared laser diode
51, 141, 221 first lens
52, 142, 222 second lens
53, 143, 223 third lens
54 fourth lens
55 fifth lens
56 sixth lens
54A, 55A, 56A lens portion
61, 151, 207 first filter
62, 152, 208 second filter
63, 153, 209 third filter
64 fourth filter
65 fifth filter
66 sixth filter
70, 170, 205 TEC
71 heat absorption plate
72 heat dissipation plate
73 semiconductor pillar
101, 121 display apparatus
102, 122 package
103 base frame
103A main surface
104, 124 shaping lens
105, 125 beam splitter
106A, 106B, 106C, 126A, 126B mirror
107, 127 monitor photodiode
108, 129 MEMS mirror
110, 161, 162, 163 wall portion
111, 119 light
120 lens
128 aperture
131, 132, 133 laser diode

The invention claimed is:

1. An optical module comprising:
a first semiconductor light-emitting element including a first emitting portion that emits first light;
a second semiconductor light-emitting element including a second emitting portion that emits second light having a wavelength different from a wavelength of the first light;
a first lens that transforms the first light emitted from the first emitting portion into a collimated beam;
a second lens that transforms the second light emitted from the second emitting portion into a collimated beam;
a filter that multiplexes the first light and the second light;
a base plate that has a first surface on which the first semiconductor light-emitting element, the second semiconductor light-emitting element, the first lens, the second lens, and the filter are mounted and a second surface opposite the first surface in a thickness direction; and
a support base that is in contact with a part of the second surface and that supports the base plate,
wherein the base plate has
a filter mounting region in which the filter is mounted,
a lens mounting region in which the first lens and the second lens are mounted, and
a semiconductor-light-emitting-element mounting region in which the first semiconductor light-emitting element and the second semiconductor light-emitting element are mounted, and
wherein the optical module has a gap between a region of the second surface corresponding to the filter mounting region and the support base.

2. The optical module according to claim 1, wherein a notch is formed in the base plate between the lens mounting region and the filter mounting region.

3. The optical module according to claim 1, wherein a thickness of the base plate in the semiconductor-light-emitting-element mounting region is more than a thickness of the base plate in the lens mounting region, and
wherein the semiconductor-light-emitting-element mounting region includes a thin region, in which a thickness of the base plate is less than thicknesses of the base plate in a region in which the first semiconductor light-emitting element is mounted and a region in which the second semiconductor light-emitting element is mounted, between the region in which the first semiconductor light-emitting element is mounted and the region in which the second semiconductor light-emitting element is mounted.

4. The optical module according to claim 1, wherein a thickness of the base plate in the semiconductor-light-emitting-element mounting region is more than a thickness of the base plate in the lens mounting region, and
wherein a thickness of the base plate in the filter mounting region is more than the thickness of the base plate in the lens mounting region.

5. The optical module according to claim 1, wherein the lens mounting region includes a thick region in at least a part of a region other than a region in which the first lens is mounted and a region in which the second lens is mounted, and
wherein, in the thick region, a thickness of the base plate is more than thicknesses of the base plate in the region in which the first lens is mounted and the region in which the second lens is mounted.

6. The optical module according to claim 1, wherein an emission direction of the first light and an emission direction of the second light are parallel to each other, and
wherein the second emitting portion is located on a straight line that is perpendicular to the emission direction of the first light and that passes through the first emitting portion when viewed in the thickness direction of the base plate.

7. The optical module according to claim 1, wherein the support base includes
an electronic cooling module that is disposed in contact with the second surface of the base plate and that adjusts a temperature of at least one of the first semiconductor light-emitting element and the second semiconductor light-emitting element.

8. The optical module according to claim 1, wherein the first semiconductor light-emitting element and the second semiconductor light-emitting element are semiconductor lasers.

* * * * *